(12) United States Patent
Uchida et al.

(10) Patent No.: US 11,784,217 B2
(45) Date of Patent: Oct. 10, 2023

(54) SILICON CARBIDE SEMICONDUCTOR DEVICE

(71) Applicant: Sumitomo Electric Industries, Ltd., Osaka (JP)

(72) Inventors: Kosuke Uchida, Osaka (JP); Toru Hiyoshi, Osaka (JP)

(*) Notice: Subject to any disclaimer, the term of this patent is extended or adjusted under 35 U.S.C. 154(b) by 0 days.

(21) Appl. No.: 16/967,767

(22) PCT Filed: Dec. 27, 2018

(86) PCT No.: PCT/JP2018/048045
§ 371 (c)(1),
(2) Date: Aug. 6, 2020

(87) PCT Pub. No.: WO2019/155783
PCT Pub. Date: Aug. 15, 2019

(65) Prior Publication Data
US 2021/0399090 A1 Dec. 23, 2021

(30) Foreign Application Priority Data
Feb. 6, 2018 (JP) ................. 2018-019588

(51) Int. Cl.
*H01L 29/06* (2006.01)
*H01L 29/10* (2006.01)
(Continued)

(52) U.S. Cl.
CPC ...... *H01L 29/0623* (2013.01); *H01L 29/0696* (2013.01); *H01L 29/1095* (2013.01);
(Continued)

(58) Field of Classification Search
CPC ............. H01L 29/0623; H01L 29/0696; H01L 29/1095; H01L 29/66068; H01L 29/7813;
(Continued)

(56) References Cited

U.S. PATENT DOCUMENTS

2004/0195618 A1   10/2004   Saito et al.
2014/0145206 A1    5/2014   Siemieniec et al.
(Continued)

FOREIGN PATENT DOCUMENTS

JP    2004-311716 A    11/2004
JP    2006-093459 A     4/2006
(Continued)

*Primary Examiner* — Cuong B Nguyen
(74) *Attorney, Agent, or Firm* — McCarter & English, LLP; Michael A. Sartori

(57) ABSTRACT

A first main surface of a silicon carbide substrate is provided with a first trench and a second trench. The first trench is defined by a first side surface and a first bottom surface. The second trench is defined by a second side surface and a second bottom surface. The silicon carbide substrate includes a first impurity region, a second impurity region, a third impurity region, and a fourth impurity region. A first insulating film is in contact with each of the first side surface and the first bottom surface. A gate electrode is provided on the first insulating film. A second insulating film is in contact with each of the second side surface and the second bottom surface. The second impurity region has a connection region electrically connected to the fourth impurity region and extending toward the fourth impurity region along the second side surface.

11 Claims, 16 Drawing Sheets

(51) Int. Cl.
  *H01L 29/66* (2006.01)
  *H01L 29/78* (2006.01)
  *H01L 21/04* (2006.01)
  *H01L 29/16* (2006.01)
  *H01L 29/167* (2006.01)
(52) U.S. Cl.
  CPC .... *H01L 29/66068* (2013.01); *H01L 29/7813* (2013.01); *H01L 21/046* (2013.01); *H01L 21/049* (2013.01); *H01L 29/167* (2013.01); *H01L 29/1608* (2013.01)
(58) Field of Classification Search
  CPC . H01L 21/046; H01L 21/049; H01L 29/1608; H01L 29/167; H01L 21/3065; H01L 29/4236; H01L 29/42352; H01L 29/66613–66628; H01L 29/7375; H01L 29/7393–7395; H01L 29/7397; H01L 29/66325; H01L 29/66333–66348; H01L 29/66712–66734; H01L 29/7802–7815
  See application file for complete search history.

(56) References Cited

U.S. PATENT DOCUMENTS

| | | | |
|---|---|---|---|
| 2015/0357415 | A1 | 12/2015 | Kagawa et al. |
| 2015/0380503 | A1 | 12/2015 | Nakano |
| 2016/0020289 | A1 | 1/2016 | Nakano et al. |
| 2018/0277371 | A1* | 9/2018 | Nakano .............. H01L 21/02241 |
| 2018/0337275 | A1* | 11/2018 | Shimizu ................ H01L 29/872 |
| 2020/0243641 | A1* | 7/2020 | Nakagawa ........ H01L 29/66696 |

FOREIGN PATENT DOCUMENTS

| | | |
|---|---|---|
| JP | 2014-107571 A | 6/2014 |
| JP | 2014-160715 A | 9/2014 |
| JP | 2014-175314 A | 9/2014 |
| JP | 2016-115847 A | 6/2016 |
| JP | 6177812 B2 | 8/2017 |
| JP | 2018-195782 A | 12/2018 |
| WO | 2017/175460 A1 | 10/2017 |

* cited by examiner

SILICON CARBIDE SEMICONDUCTOR DEVICE

TECHNICAL FIELD

The present disclosure relates to a silicon carbide semiconductor device. The present application claims priority to Japanese Patent Application No. 2018-019588 filed on Feb. 6, 2018, the entire contents of which are incorporated herein by reference.

BACKGROUND ART

Japanese Patent Laying-Open No. 2014-160715 (PTL 1) discloses a trench type metal oxide semiconductor field effect transistor (MOSFET) in which a main surface of a silicon carbide substrate is provided with a gate trench.

CITATION LIST

Patent Literature

PTL 1: Japanese Patent Laying-Open No. 2014-160715

SUMMARY OF INVENTION

A silicon carbide semiconductor device according to the present disclosure includes a silicon carbide substrate, a first insulating film, a gate electrode, and a second insulating film. The silicon carbide substrate has a first main surface, and a second main surface opposite to the first main surface. The first main surface is provided with a first trench and a second trench. The first trench is defined by a first side surface, and a first bottom surface continuous with the first side surface. The second trench is defined by a second side surface, and a second bottom surface continuous with the second side surface. The silicon carbide substrate includes a first impurity region having a first conductivity type, a second impurity region in contact with the first impurity region and having a second conductivity type different from the first conductivity type, a third impurity region provided on the second impurity region so as to be separated from the first impurity region and having the first conductivity type, and a fourth impurity region provided between the second main surface and the second bottom surface and having the second conductivity type. The first insulating film is in contact with each of the first side surface and the first bottom surface. The gate electrode is provided on the first insulating film. The second insulating film is in contact with each of the second side surface and the second bottom surface. The second impurity region has a connection region electrically connected to the fourth impurity region and extending toward the fourth impurity region along the second side surface.

A silicon carbide semiconductor device according to the present disclosure includes a silicon carbide substrate, a first insulating film, a gate electrode, a second insulating film, a source electrode, a filling portion, and an interlayer insulating film. The silicon carbide substrate has a first main surface, and a second main surface opposite to the first main surface. The first main surface is provided with a first trench and a second trench. The first trench is defined by a first side surface, and a first bottom surface continuous with the first side surface. The second trench is defined by a second side surface, and a second bottom surface continuous with the second side surface. The silicon carbide substrate includes a first impurity region having a first conductivity type, a second impurity region in contact with the first impurity region and having a second conductivity type different from the first conductivity type, a third impurity region provided on the second impurity region so as to be separated from the first impurity region and having the first conductivity type, and a fourth impurity region provided between the second main surface and the second bottom surface and having the second conductivity type. The first insulating film is in contact with each of the first side surface and the first bottom surface. The gate electrode is provided on the first insulating film. The second insulating film is in contact with each of the second side surface and the second bottom surface. The source electrode is electrically connected to the third impurity region. The filling portion is provided on the second insulating film. The interlayer insulating film covers each of the gate electrode and the filling portion. The second impurity region has a connection region electrically connected to the fourth impurity region and extending toward the fourth impurity region along the second side surface. As seen in a direction perpendicular to the second main surface, in each unit cell, an area of an opening in the second trench is smaller than an area of an opening in the first trench. As seen in the direction perpendicular to the second main surface, in each unit cell, an area of the source electrode is greater than the area of the opening in the second trench. As seen in the direction perpendicular to the second main surface, the area of the opening in the second trench is greater than an area of the second bottom surface. As seen in the direction perpendicular to the second main surface, the first trench extends in a first direction parallel to the second main surface, and the second trench is provided next to the first trench in the first direction.

DETAILED DESCRIPTION

Figure 1:
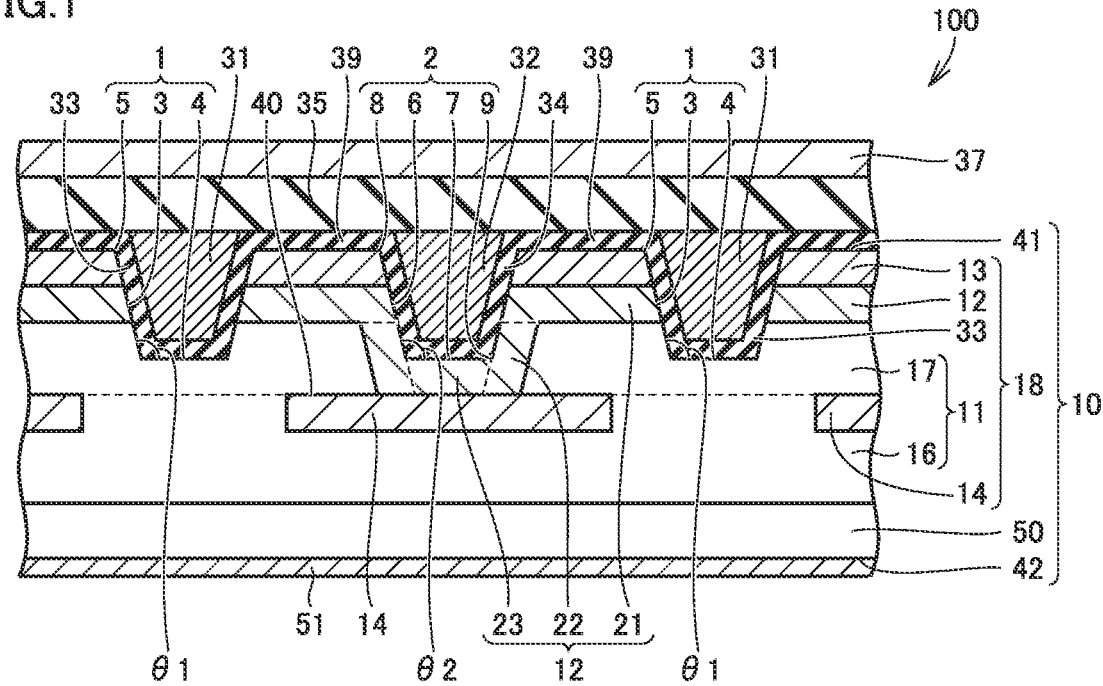
FIG. 1 is a schematic cross-sectional view taken along the line I-I in a direction of arrows in FIG. 3.

Summary of Embodiment of the Present Disclosure

A summary of an embodiment of the present disclosure is initially provided.

(1) A silicon carbide semiconductor device 100 according to the present disclosure includes a silicon carbide substrate 10, a first insulating film 33, a gate electrode 31, and a second insulating film 34. Silicon carbide substrate 10 has a first main surface 41, and a second main surface 42 opposite to first main surface 41. First main surface 41 is provided with a first trench 1 and a second trench 2. First trench 1 is defined by a first side surface 3, and a first bottom surface 4 continuous with first side surface 3. Second trench 2 is defined by a second side surface 6, and a second bottom surface 7 continuous with second side surface 6. Silicon carbide substrate 10 includes a first impurity region 11 having a first conductivity type, a second impurity region 12 in contact with first impurity region 11 and having a second conductivity type different from the first conductivity type, a third impurity region 13 provided on second impurity region 12 so as to be separated from first impurity region 11 and having the first conductivity type, and a fourth impurity region 14 provided between second main surface 42 and second bottom surface 7 and having the second conductivity type. First insulating film 33 is in contact with each of first side surface 3 and first bottom surface 4. Gate electrode 31 is provided on first insulating film 33. Second insulating film 34 is in contact with each of second side surface 6 and second bottom surface 7. Second impurity region 12 has a connection region 22 electrically connected to fourth impurity region 14 and extending toward fourth impurity region 14 along second side surface 6.

(2) According to silicon carbide semiconductor device 100 according to (1), as seen in a direction perpendicular to second main surface 42, in each unit cell 120, an area of an opening 8 in second trench 2 may be smaller than an area of an opening 5 in first trench 1.

(3) Silicon carbide semiconductor device 100 according to (1) or (2) may further include a source electrode 36 electrically connected to third impurity region 13. As seen in the direction perpendicular to second main surface 42, in each unit cell 120, an area of source electrode 36 may be greater than the area of opening 8 in second trench 2.

(4) According to silicon carbide semiconductor device 100 according to any one of (1) to (3), fourth impurity region 14 may be separated from second bottom surface 7.

(5) According to silicon carbide semiconductor device 100 according to any one of (1) to (3), fourth impurity region 14 may be in contact with second bottom surface 7.

(6) According to silicon carbide semiconductor device 100 according to any one of (1) to (5), as seen in the direction perpendicular to second main surface 42, first trench 1 may have a stripe shape.

(7) According to silicon carbide semiconductor device 100 according to any one of (1) to (6), as seen in the direction perpendicular to second main surface 42, the area of opening 8 in second trench 2 may be greater than an area of second bottom surface 7.

(8) According to silicon carbide semiconductor device 100 according to any one of (1) to (7), an angle θ1 formed between first side surface 3 and first bottom surface 4 may be not less than 80° and not more than 100°, and an angle θ2 formed between second side surface 6 and second bottom surface 7 may be greater than angle θ1 formed between first side surface 3 and first bottom surface 4.

(9) Silicon carbide semiconductor device 100 according to any one of (1) to (8) may further include a filling portion 32 provided on second insulating film 34, and an interlayer insulating film 35 covering each of gate electrode 31 and filling portion 32.

(10) According to silicon carbide semiconductor device 100 according to any one of (1) to (9), as seen in the direction perpendicular to second main surface 42, fourth impurity region 14 may have a first portion 61 overlapping first bottom surface 4.

(11) According to silicon carbide semiconductor device 100 according to (10), silicon carbide substrate 10 may further include a fifth impurity region 15 in contact with third impurity region 13 and having the second conductivity type. As seen in the direction perpendicular to the second main surface, fourth impurity region 14 may have a second portion 62 overlapping fifth impurity region 15 and electrically connected to first portion 61.

(12) According to silicon carbide semiconductor device 100 according to any one of (1) to (11), as seen in the direction perpendicular to second main surface 42, first trench 1 may extend in a first direction 101 parallel to second main surface 42, and second trench 2 may be provided next to first trench 1 in first direction 101.

(13) A silicon carbide semiconductor device 100 according to the present disclosure includes a silicon carbide substrate 10, a first insulating film 33, a gate electrode 31, a second insulating film 34, a source electrode 36, a filling portion 32, and an interlayer insulating film 35. Silicon carbide substrate 10 has a first main surface 41, and a second main surface 42 opposite to first main surface 41. First main surface 41 is provided with a first trench 1 and a second trench 2. First trench 1 is defined by a first side surface 3, and a first bottom surface 4 continuous with first side surface 3. Second trench 2 is defined by a second side surface 6, and a second bottom surface 7 continuous with second side surface 6. Silicon carbide substrate 10 includes a first impurity region 11 having a first conductivity type, a second impurity region 12 in contact with first impurity region 11 and having a second conductivity type different from the first conductivity type, a third impurity region 13 provided on second impurity region 12 so as to be separated from first impurity region 11 and having the first conductivity type, and a fourth impurity region 14 provided between second main surface 42 and second bottom surface 7 and having the second conductivity type. First insulating film 33 is in contact with each of first side surface 3 and first bottom surface 4. Gate electrode 31 is provided on first insulating film 33. Second insulating film 34 is in contact with each of second side surface 6 and second bottom surface 7. Source electrode 36 is electrically connected to third impurity region 13. Filling portion 32 is provided on second insulating film 34. Interlayer insulating film 35 covers each of gate electrode 31 and filling portion 32. Second impurity region 12 has a connection region 22 electrically connected to fourth impurity region 14 and extending toward fourth impurity region 14 along second side surface 6. As seen in a direction perpendicular to second main surface 42, in each unit cell 120, an area of an opening 8 in second trench 2 is smaller than an area of an opening 5 in first trench 1. As seen in the direction perpendicular to second main surface 42, in each unit cell 120, an area of source electrode 36 is greater than the area of opening 8 in second trench 2. As seen in the direction perpendicular to second main surface 42, the area of opening 8 in second trench 2 is greater than an area of second bottom surface 7. As seen in the direction perpendicular to second main surface 42, first trench 1 extends in a first direction 101 parallel to second main surface 42, and second trench 2 is provided next to first trench 1 in first direction 101.

Details of Embodiment of the Present Disclosure

The embodiment is hereinafter described based on the drawings. The same or corresponding parts are designated by the same reference numbers in the drawings below and the description thereof will not be repeated. Regarding crystallographic denotation herein, an individual orientation, a group orientation, an individual plane, and a group plane are shown in [ ], < >, ( ), and { }, respectively. A crystallographically negative index is normally expressed by a number with a bar "-" thereabove, however, a negative sign herein precedes a number.

A configuration of a MOSFET 100 as an example silicon carbide semiconductor device according to the present embodiment is initially described.

Figure 2:
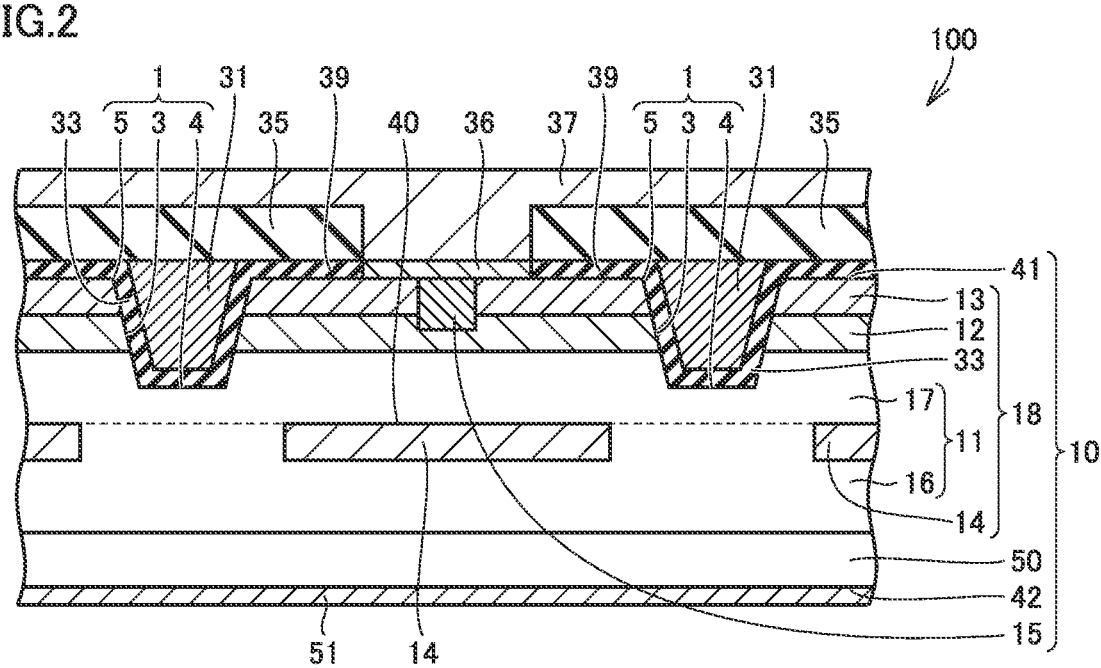
FIG. 2 is a schematic cross-sectional view taken along the line II-II in a direction of arrows in FIG. 3.

As shown in FIGS. 1 and 2, MOSFET 100 according to the present embodiment mainly includes a silicon carbide substrate 10, a gate electrode 31, a filling portion 32, a source electrode 36, a drain electrode 51, a first insulating film 33, a second insulating film 34, a third insulating film 39, an interlayer insulating film 35, and a source wire 37. Silicon carbide substrate 10 includes a silicon carbide single-crystal substrate 50, and a silicon carbide epitaxial layer 18 on silicon carbide single-crystal substrate 50. Silicon carbide substrate 10 has a first main surface 41, and a second main surface 42 opposite to first main surface 41. Silicon carbide epitaxial layer 18 forms first main surface 41. Silicon carbide single-crystal substrate 50 forms second main surface 42. Silicon carbide single-crystal substrate 50 and silicon carbide epitaxial layer 18 are made of hexagonal silicon carbide having a polytype of 4H, for example. Silicon carbide single-crystal substrate 50 contains an n type impurity such as nitrogen (N) and has n type (first conductivity type).

First main surface 41 is a {0001} plane, or a plane inclined at an off angle of not more than 8° in an off direction relative to the {0001} plane. Preferably, first main surface 41 is a (000-1) plane, or a plane inclined at an off angle of not more than 8° in an off direction relative to the (000-1) plane. The off direction may be a <11-20> direction or a <1-100> direction, for example. The off angle may be not less than 1° or not less than 2°, for example. The off angle may be not more than 6° or not more than 4°.

Silicon carbide epitaxial layer 18 mainly includes a drift region 11 (first impurity region 11), a second impurity region 12, a source region 13 (third impurity region 13), a fourth impurity region 14, and a fifth impurity region 15 (contact region 15). Drift region 11 contains an n type impurity such as nitrogen, and has n type conductivity. Drift region 11 has a first drift layer 16 and a second drift layer 17, for example. A concentration of the n type impurity in first drift layer 16 may be the same as a concentration of the n type impurity in second drift layer 17, or may be lower than the concentration of the n type impurity in second drift layer 17.

Second impurity region 12 is in contact with drift region 11. Second impurity region 12 contains a p type impurity such as aluminum (Al), and has p type conductivity (second conductivity type). A concentration of the p type impurity in second impurity region 12 may be higher than the concentration of the n type impurity in drift region 11.

Source region 13 is provided on second impurity region 12 so as to be separated from drift region 11 by second impurity region 12. Source region 13 contains an n type impurity such as nitrogen or phosphorus (P), and has n type conductivity. Source region 13 forms a part of first main surface 41. A concentration of the n type impurity in source region 13 may be higher than the concentration of the p type impurity in second impurity region 12. The concentration of the n type impurity in source region 13 is about $1 \times 10^{19}$ cm$^{-3}$, for example.

First main surface 41 is provided with a first trench 1 and a second trench 2. First trench 1 is defined by a first side surface 3 and a first bottom surface 4. First bottom surface 4 is continuous with first side surface 3. First side surface 3 extends through each of source region 13 and second impurity region 12. First side surface 3 reaches drift region 11. First bottom surface 4 is located in drift region 11. First bottom surface 4 is substantially parallel to first main surface 41. First side surface 3 is formed by each of source region 13, second impurity region 12 and drift region 11. First bottom surface 4 is formed by drift region 11. A first angle θ1 formed between first side surface 3 and first bottom surface 4 may be greater than 90°, for example. First angle θ1 is not less than 115° and not more than 135°, for example.

Second trench 2 is defined by a second side surface 6 and a second bottom surface 7. Second bottom surface 7 is continuous with second side surface 6. Second side surface 6 may extend through source region 13. First side surface 3 reaches second impurity region 12. Second bottom surface 7 is located in second impurity region 12. Second bottom surface 7 is substantially parallel to second main surface 42. Second side surface 6 is formed by each of source region 13 and second impurity region 12. Second bottom surface 7 is formed by second impurity region 12. A second angle θ2 formed between second side surface 6 and second bottom surface 7 may be greater than 90°, for example. Second angle θ2 is not less than 115° and not more than 135°, for example.

Second impurity region 12 has a body region 21, a first connection region 22, and a second connection region 23. Body region 21 is provided on drift region 11. A portion of body region 21 that is in contact with first side surface 3 of first trench 1 can form a channel. First connection region 22 is electrically connected to fourth impurity region 14. First connection region 22 extends toward fourth impurity region 14 along second side surface 6. First connection region 22 is continuous with each of body region 21 and fourth impurity region 14.

First connection region 22 is located between body region 21 and second connection region 23. First connection region 22 may be provided opposite to source region 13 as seen from body region 21. First connection region 22 lies between drift region 11 and second side surface 6. First connection region 22 forms a part of second side surface 6. Second connection region 23 is continuous with first connection region 22. Second connection region 23 is provided between second bottom surface 7 and fourth impurity region 14. Second connection region 23 may be surrounded by first connection region 22. Second connection region 23 is in contact with each of second bottom surface 7 and fourth impurity region 14. Second connection region 23 forms second bottom surface 7.

Fourth impurity region 14 contains a p type impurity such as aluminum (Al), and has p type conductivity (second conductivity type). A concentration of the p type impurity in fourth impurity region 14 is not less than $5 \times 10^{17}$ cm$^{-3}$ and not more than $5 \times 10^{18}$ cm$^{-3}$, for example. Fourth impurity region 14 is provided between second main surface 42 and second bottom surface 7. The impurity concentration in fourth impurity region 14 may be higher than the impurity concentration in second impurity region 12. Fourth impurity region 14 may be separated from second bottom surface 7. An upper end portion 40 of fourth impurity region 14 may face source region 13. Upper end portion 40 may extend to a position facing first side surface 3 of first trench 1, or may extend to a position facing a part of first bottom surface 4.

First insulating film 33 is a gate insulating film. First insulating film 33 is made of a material including silicon dioxide, for example. First insulating film 33 is in contact with each of first side surface 3 and first bottom surface 4. First insulating film 33 is in contact with drift region 11 at first bottom surface 4. First insulating film 33 is in contact with each of source region 13, body region 21 and drift region 11 at first side surface 3.

Gate electrode 31 is provided on first insulating film 33. Gate electrode 31 is made of polysilicon containing a conductive impurity, for example. Gate electrode 31 is disposed within first trench 1. Gate electrode 31 faces each of source region 13, body region 21 and drift region 11.

Second insulating film 34 is in contact with each of second side surface 6 and second bottom surface 7. Second insulating film 34 is made of a material including silicon dioxide, for example. Second insulating film 34 is in contact with second connection region 23 at second bottom surface 7. Second insulating film 34 may be in contact with each of source region 13, body region 21 and first connection region 22 at second side surface 6.

Filling portion 32 is provided on second insulating film 34. Filling portion 32 is made of polysilicon containing a conductive impurity, for example. Filling portion 32 is disposed within second trench 2. Filling portion 32 faces each of source region 13 and second impurity region 12. Filling portion 32 may be electrically separated from gate electrode 31, for example. Filling portion 32 may be a conductor or an insulator, as long as it can fill second trench 2.

Third insulating film 39 is provided on first main surface 41. Third insulating film 39 is located between first insulating film 33 and second insulating film 34. Third insulating film 39 is in contact with each of first insulating film 33 and second insulating film 34. Third insulating film 39 may be in contact with source region 13 at first main surface 41. As shown in FIG. 2, third insulating film 39 may be in contact with source electrode 36.

Interlayer insulating film 35 is provided to cover each of first trench 1 and second trench 2. Specifically, interlayer insulating film 35 is in contact with each of first insulating film 33, gate electrode 31, second insulating film 34, filling portion 32 and third insulating film 39. Interlayer insulating film 35 covers each of gate electrode 31 and filling portion 32. Interlayer insulating film 35 is made of a material including silicon dioxide, for example. Interlayer insulating film 35 electrically insulates gate electrode 31 from source electrode 36.

Drain electrode 51 is in contact with second main surface 42. Drain electrode 51 is in contact with silicon carbide single-crystal substrate 50 at second main surface 42. Drain electrode 51 is electrically connected to drift region 11. Drain electrode 51 is made of a material including NiSi or TiAlSi, for example.

As shown in FIG. 2, contact region 15 forms a part of first main surface 41. Contact region 15 contains a p type impurity such as aluminum, and has p type conductivity. Contact region 15 extends through source region 13 and is in contact with body region 21. Contact region 15 is in contact with source region 13. Contact region 15 may face fourth impurity region 14. A concentration of the p type impurity in contact region 15 is higher than a concentration of the p type impurity in body region 21, for example. The concentration of the p type impurity in contact region 15 is not less than $1 \times 10^{18}$ cm$^{-3}$ and not more than $1 \times 10^{20}$ cm$^{-3}$, for example.

Source electrode 36 is provided on first main surface 41. Source electrode 36 is electrically connected to source region 13. Source electrode 36 may be in contact with source region 13 and contact region 15 at first main surface 41. Source electrode 36 is made of a material including Ti, Al and Si, for example. Source electrode 36 is in ohmic contact with source region 13. Source electrode 36 may be in ohmic contact with contact region 15.

Source wire 37 is connected to source electrode 36. Source wire 37 covers each of source electrode 36 and interlayer insulating film 35. Source wire 37 is made of a material including aluminum, for example. As shown in FIG. 1, source wire 37 is provided on interlayer insulating film 35. Source wire 37 may cover each of first trench 1 and second trench 2. Likewise, source wire 37 may cover each of gate electrode 31 and filling portion 32.

Figure 3:
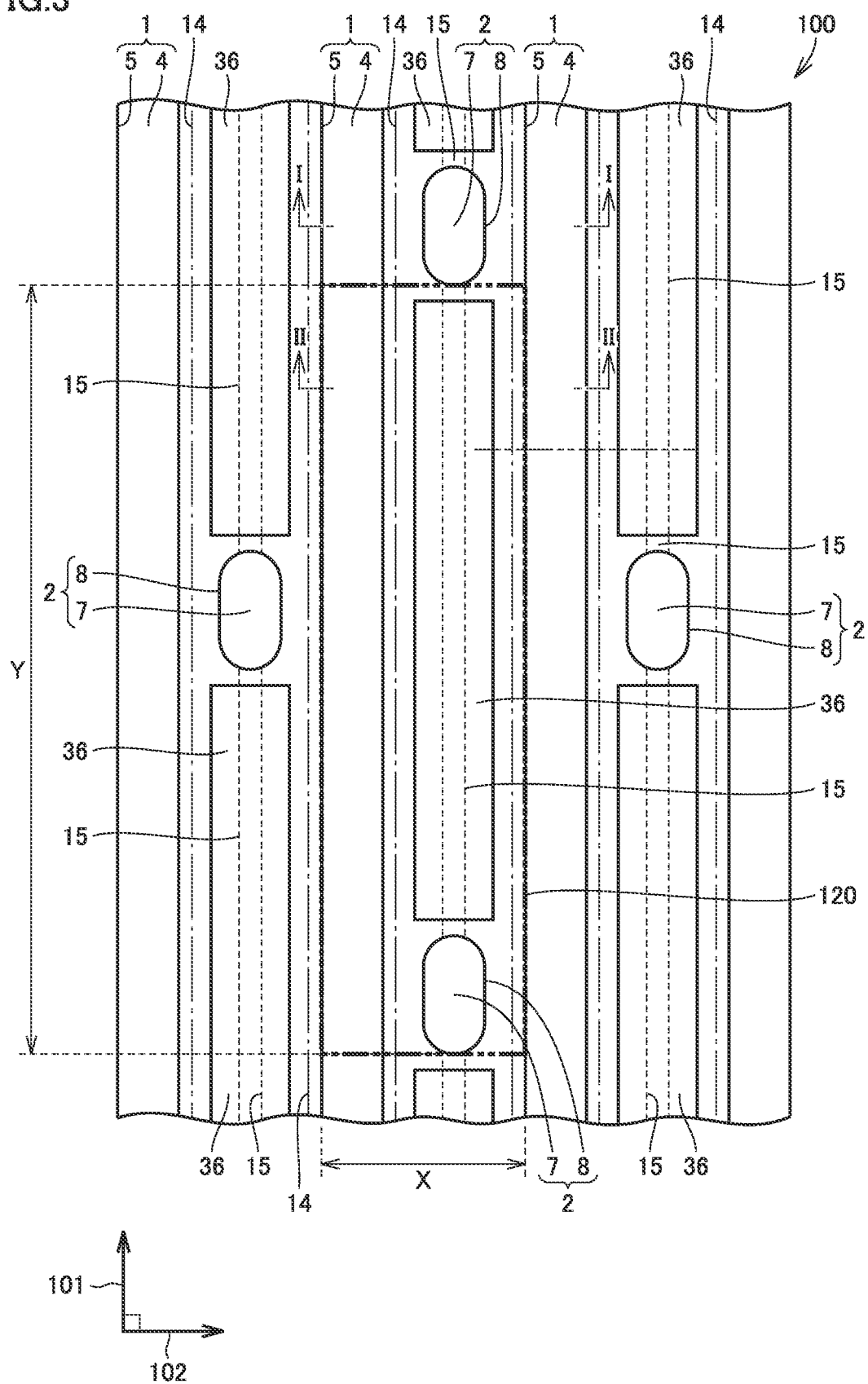
FIG. 3 is a schematic plan view showing a configuration of a silicon carbide semiconductor device according to the present embodiment.

As shown in FIG. 3, as seen in a direction perpendicular to second main surface 42, first trench 1 has a stripe shape. Specifically, first trench 1 extends in a first direction 101 parallel to second main surface 42. First direction 101 is a <11-20> direction, for example. The length of first trench 1 in first direction 101 is greater than the length of first trench 1 in a second direction 102. Second direction 102 is a direction parallel to second main surface 42 and perpendicular to first direction 101. Second direction 102 is a <1-100> direction, for example. Stated from another perspective, first direction 101 and second direction 102 are a longitudinal direction and a transverse direction of first trench 1, respectively. A plurality of first trenches 1 may be provided at a distance from one another in second direction 102.

As seen in the direction perpendicular to second main surface 42, second trench 2 is disposed next to first trench 1. Specifically, second trench 2 may be provided between two first trenches 1 adjacent to each other in second direction 102. Second trench 2 may be provided between two source electrodes 36 adjacent to each other in first direction 101. The length of second trench 2 in first direction 101 is smaller than the length of first trench 1 in first direction 101.

As seen in the direction perpendicular to second main surface 42, contact region 15 extends in first direction 101. The length of contact region 15 in first direction 101 may be greater than the length of contact region 15 in second direction 102. Stated from another perspective, first direction 101 and second direction 102 are a longitudinal direction and a transverse direction of contact region 15, respectively. Contact region 15 extends in a direction parallel to the longitudinal direction of first trench 1.

As seen in the direction perpendicular to second main surface 42, fourth impurity region 14 extends in first direction 101. The length of fourth impurity region 14 in first direction 101 is greater than the length of fourth impurity region 14 in second direction 102. Stated from another perspective, first direction 101 and second direction 102 are a longitudinal direction and a transverse direction of fourth impurity region 14, respectively. Fourth impurity region 14 extends in the direction parallel to the longitudinal direction of first trench 1. As seen in the direction perpendicular to second main surface 42, contact region 15 may overlap fourth impurity region 14. The length of fourth impurity region 14 in second direction 102 may be greater than the length of contact region 15 in second direction 102.

As seen in the direction perpendicular to second main surface 42, source electrode 36 extends in first direction 101. The length of source electrode 36 in first direction 101 is greater than the length of source electrode 36 in second direction 102. Stated from another perspective, first direction 101 and second direction 102 are a longitudinal direction and a transverse direction of source electrode 36, respectively. Source electrode 36 extends in the direction parallel to the longitudinal direction of first trench 1. The length of source electrode 36 in first direction 101 may be smaller than the length of first trench 1 in first direction 101.

As seen in the direction perpendicular to second main surface 42, source electrode 36 may overlap fourth impurity region 14. The length of source electrode 36 in second direction 102 may be smaller than the length of fourth impurity region 14 in second direction 102. The length of source electrode 36 in first direction 101 may be smaller than the length of fourth impurity region 14 in first direction 101. As seen in the direction perpendicular to second main surface 42, source electrode 36 overlaps contact region 15. The length of source electrode 36 in second direction 102 may be greater than the length of contact region 15 in second direction 102. The length of source electrode 36 in first direction 101 may be smaller than the length of contact region 15 in first direction 101.

As shown in FIG. 3, according to the present embodiment, first trenches 1 are provided at regular intervals in second direction 102. An interval between two adjacent first trenches 1 is X. Second trenches 2 are provided at regular intervals in first direction 101. An interval between two adjacent second trenches 2 is Y. A unit cell 120 is a region representing a unit of interval patterns of first trenches 1 and second trenches 2. In the present embodiment, a region defined by a region having width X in first direction 101 and a region having width Y in second direction 102 is defined as unit cell 120.

As seen in the direction perpendicular to second main surface 42, in each unit cell 120, the area of a second opening 8 in second trench 2 may be smaller than the area of a first opening 5 in first trench 1. The area of first opening 5 in first trench 1 may be not less than three times, or not less than ten times the area of second opening 8 in second trench 2. While an upper limit of the area of first opening 5 in first trench 1 is not particularly limited, the area of first opening 5 in first trench 1 may be not more than twenty times the area of second opening 8 in second trench 2.

As seen in the direction perpendicular to second main surface 42, in each unit cell 120, the area of source electrode 36 may be greater than the area of second opening 8 in second trench 2. The area of source electrode 36 may be not less than three times, or not less than ten times the area of second opening 8 in second trench 2. While an upper limit of the area of source electrode 36 is not particularly limited, the area of source electrode 36 may be not more than twenty times the area of second opening 8 in second trench 2.

As shown in FIG. 3, the interval of second trenches 2 in second direction 102 may be twice the interval of first trenches 1 in second direction 102. Specifically, between two second trenches 2 adjacent to each other in second direction 102, one source electrode 36 and two first trenches 1 sandwiching this one source electrode 36 between them may be disposed.

Alternatively, fourth impurity region 14 may extend in a direction perpendicular to the longitudinal direction of first trench 1 and parallel to second main surface 42. Stated from another perspective, fourth impurity region 14 may be provided to extend in second direction 102. In this case, the longitudinal direction and the transverse direction of fourth impurity region 14 are second direction 102 and first direction 101, respectively.

The shape of second trench 2 in plan view is now described.

Figure 4:
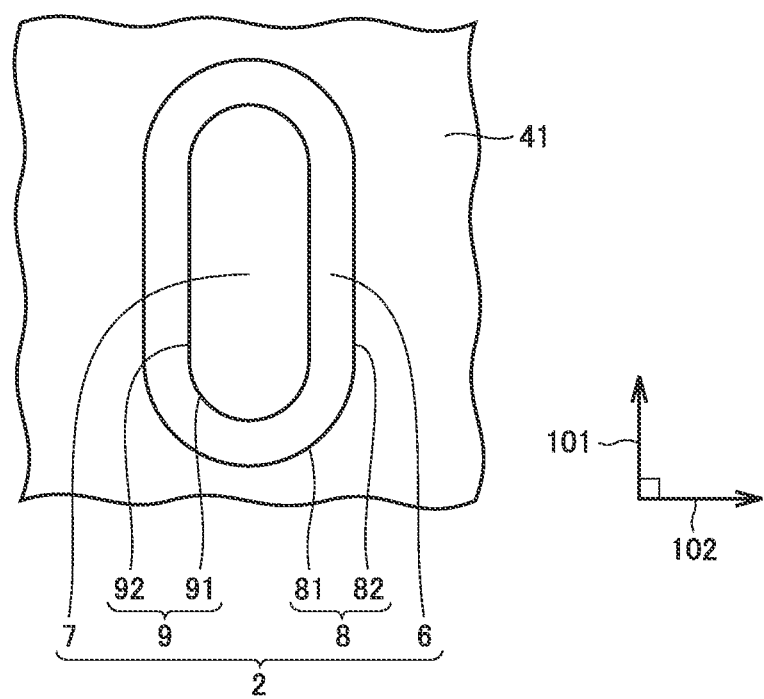
FIG. 4 is a schematic plan view showing a configuration of a second trench in the silicon carbide semiconductor device according to the present embodiment.

As shown in FIG. 4, second trench 2 has a boundary portion 9 between second side surface 6 and second bottom surface 7. As seen in the direction perpendicular to second main surface 42, boundary portion 9 has a first curvature portion 91, and a first linear portion 92 continuous with first curvature portion 91. First linear portion 92 extends in first direction 101, for example. First curvature portion 91 is arc-shaped, for example. Second opening 8 in second trench 2 has a second curvature portion 81, and a second linear portion 82 continuous with second curvature portion 81. Second linear portion 82 extends in first direction 101, for example. Second curvature portion 81 is arc-shaped, for example. As seen in the direction perpendicular to second main surface 42, the area of second opening 8 in second trench 2 may be greater than the area of second bottom surface 7. Stated from another perspective, the width of second trench 2 may expand from second bottom surface 7 toward first main surface 41.

A configuration of silicon carbide semiconductor device 100 according to a first variation of the present embodiment is now described.

Figure 5:
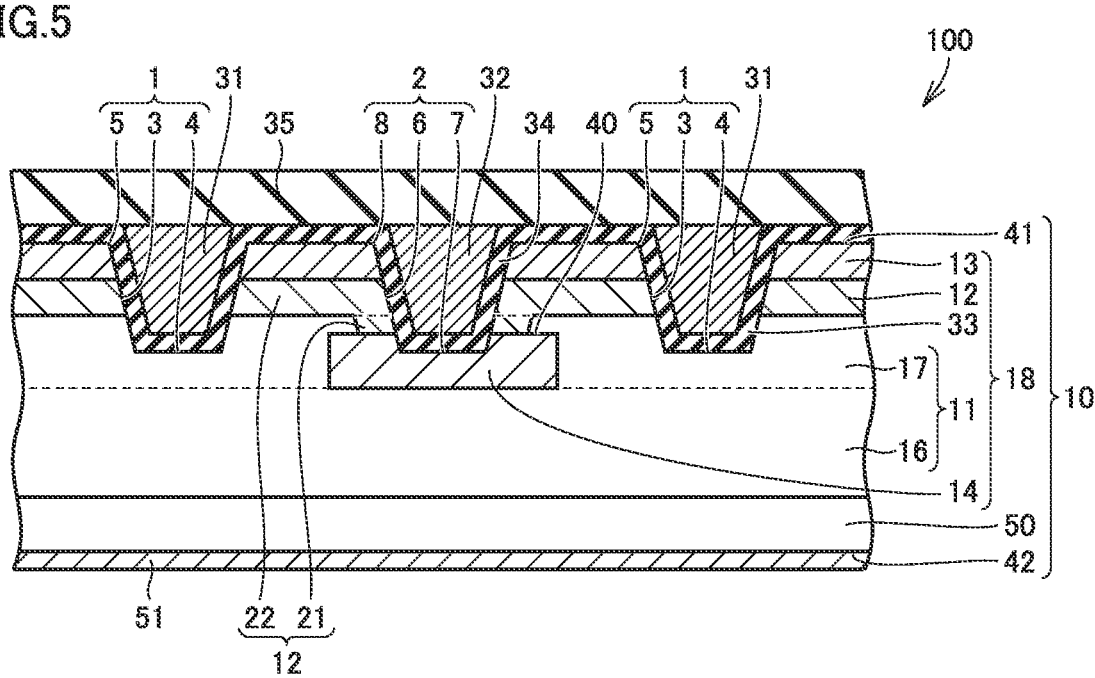
FIG. 5 is a schematic cross-sectional view showing a configuration of a silicon carbide semiconductor device according to a first variation of the present embodiment.

As shown in FIG. 5, according to silicon carbide semiconductor device 100 according to the first variation, fourth impurity region 14 may be in contact with second bottom surface 7 of second trench 2. In other words, second bottom surface 7 may be formed by fourth impurity region 14. Second side surface 6 of second trench 2 may be formed by each of source region 13, body region 21, connection region 22 and fourth impurity region 14. In the direction perpendicular to second main surface 42, upper end portion 40 of fourth impurity region 14 may be located closer to first main surface 41 than second bottom surface 7.

Alternatively, in the direction perpendicular to second main surface 42, upper end portion 40 of fourth impurity region 14 may be disposed at the same position as second bottom surface 7. In this case, second side surface 6 is formed by each of source region 13, body region 21 and connection region 22.

A configuration of silicon carbide semiconductor device 100 according to a second variation of the present embodiment is now described.

Figure 6:
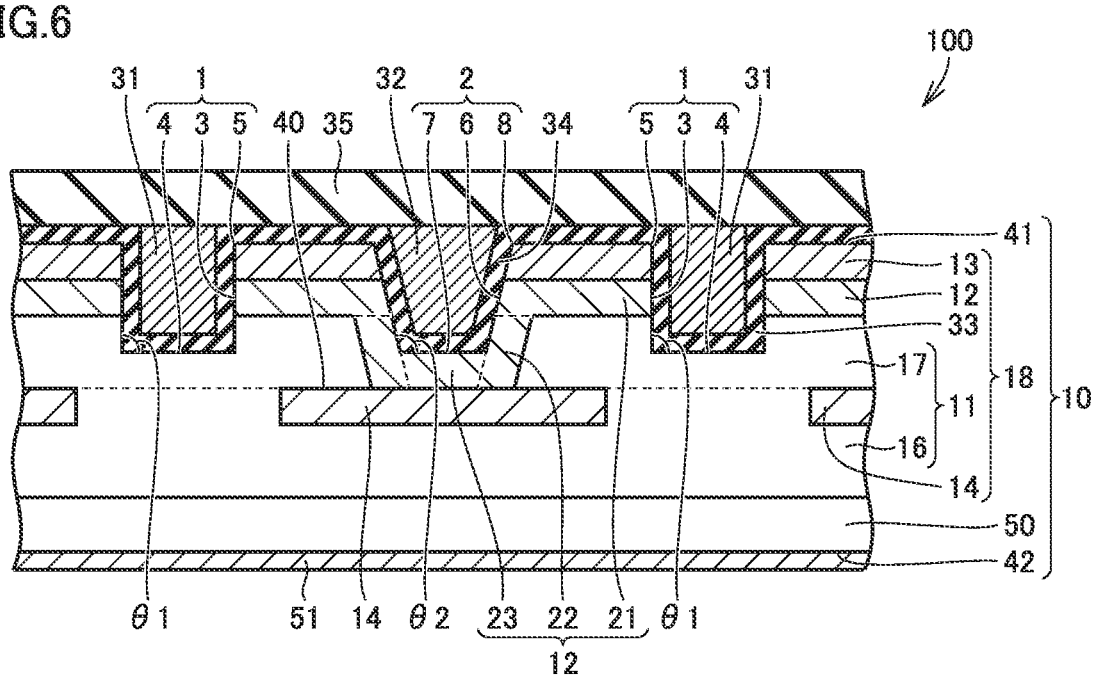
FIG. 6 is a schematic cross-sectional view showing a configuration of a silicon carbide semiconductor device according to a second variation of the present embodiment.

As shown in FIG. 6, first trench 1 may be a vertical trench. In other words, first angle θ1 formed between first side surface 3 and first bottom surface 4 may be 90°. In this case, in second direction 102, the width of first bottom surface 4 is substantially the same as the width of first opening 5. The vertical trench may be employed as first trench 1 of MOSFET 100 shown in FIG. 5.

First angle θ1 may be slightly deviate from 90° due to manufacturing variations and the like. Specifically, first angle θ1 formed between first side surface 3 and first bottom surface 4 may be not less than 80° and not more than 100°. Second angle θ2 formed between second side surface 6 and second bottom surface 7 may be greater than first angle θ1 formed between first side surface 3 and first bottom surface 4. Second angle θ2 is not less than 115° and not more than 135°, for example.

A configuration of silicon carbide semiconductor device 100 according to a third variation of the present embodiment is now described.

Figure 7:
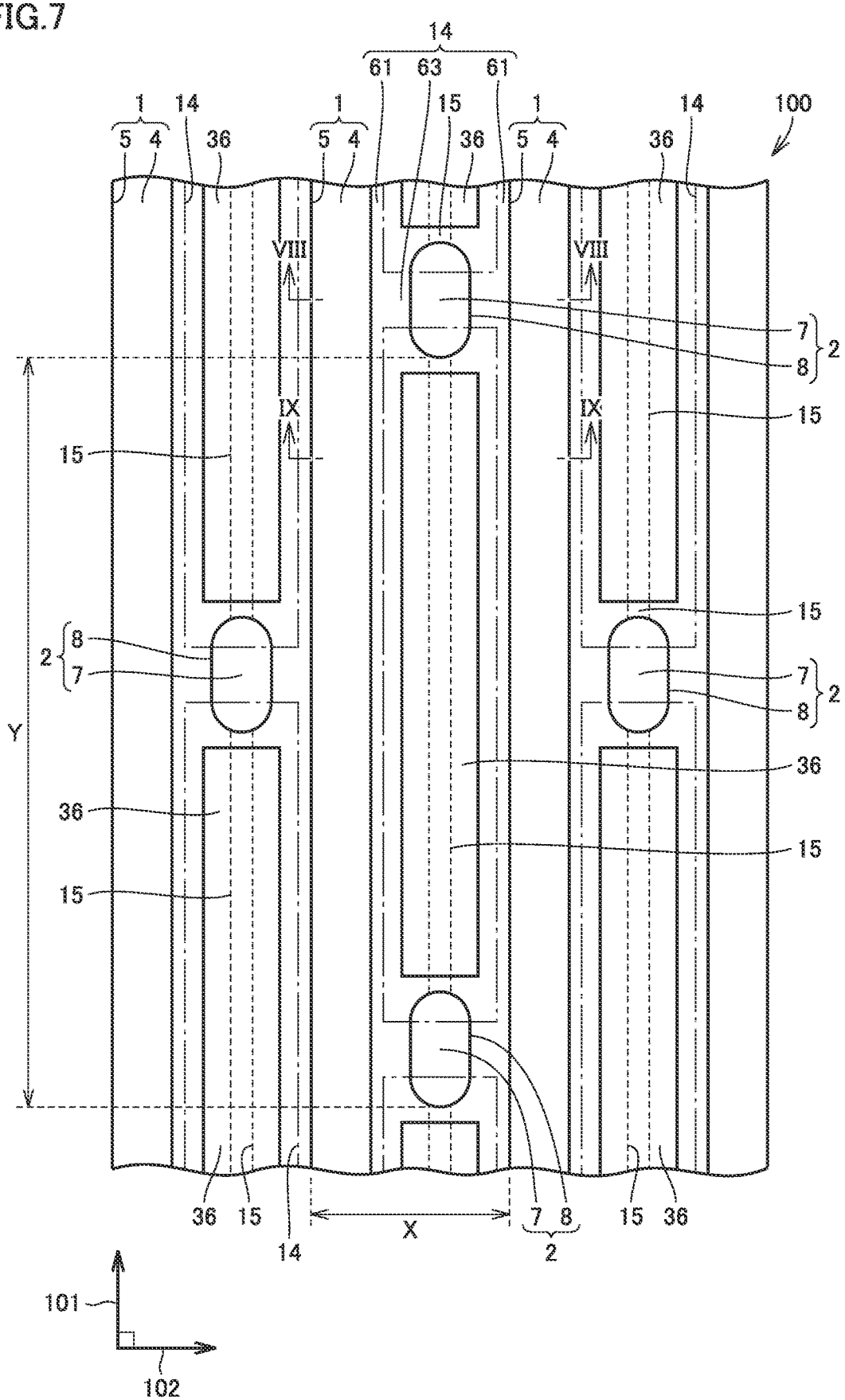
FIG. 7 is a schematic plan view showing a configuration of a silicon carbide semiconductor device according to a third variation of the present embodiment.

As shown in FIG. 7, as seen in the direction perpendicular to second main surface 42, fourth impurity region 14 may have a first portion 61 overlapping first bottom surface 4 of first trench 1, and a third portion 63 overlapping second bottom surface 7 of second trench 2. First portion 61 extends in a longitudinal direction of first bottom surface 4. Stated from another perspective, first portion 61 extends in first direction 101. A longitudinal direction and a transverse direction of first portion 61 are first direction 101 and second direction 102, respectively. In second direction 102, the width of first portion 61 may be greater than the width of first opening 5 in first trench 1, or may be the same as the width of first opening 5 in first trench 1.

As shown in FIG. 7, as seen in the direction perpendicular to second main surface 42, third portion 63 may overlap a part of second bottom surface 7, and not overlap the remaining part of second bottom surface 7. Third portion 63 extends in the transverse direction of first portion 61, for example. Third portion 63 connects two adjacent first portions 61 together. A longitudinal direction of third portion 63 may be the same as the transverse direction of first portion 61. Stated from another perspective, the longitudinal direction and a transverse direction of third portion 63 may be second direction 102 and first direction 101, respectively. In first direction 101, the width of third portion 63 may be smaller than the width of second opening 8 in second trench 2. In second direction 102, the width of third portion 63 may be greater than the width of second opening 8 in second trench 2.

Figure 8:
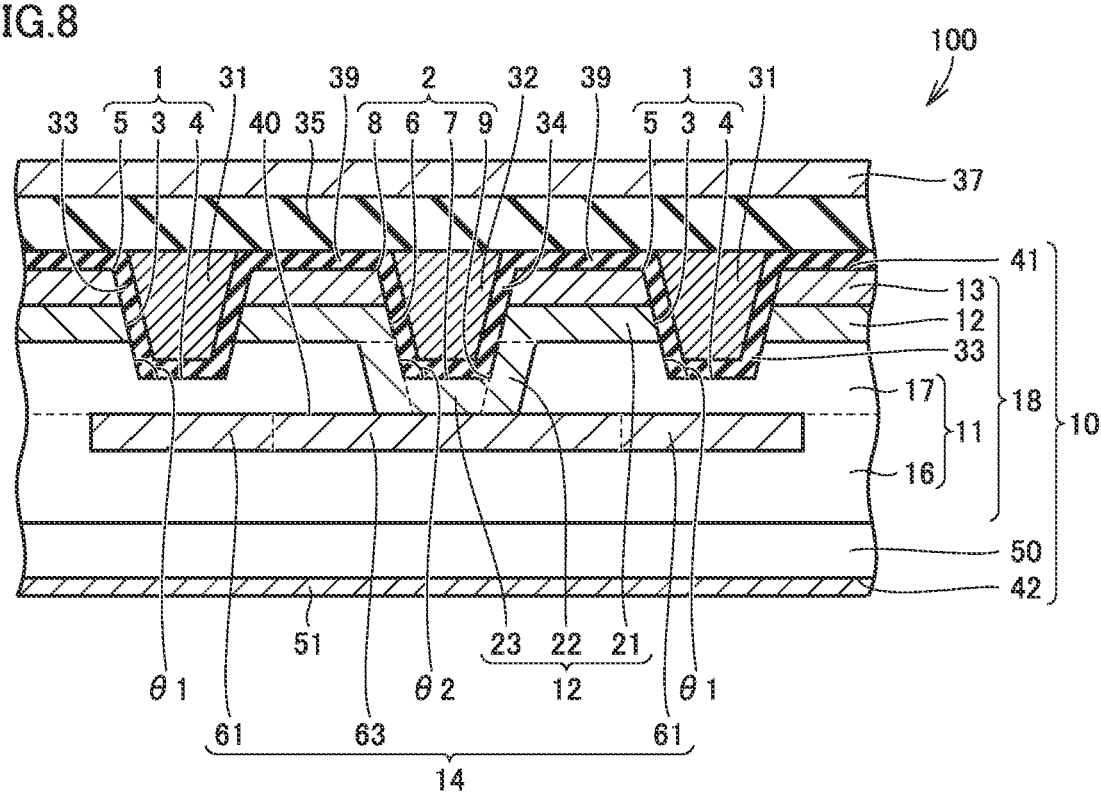
FIG. 8 is a schematic cross-sectional view taken along the line VIII-VIII in a direction of arrows in FIG. 7.
Figure 9:
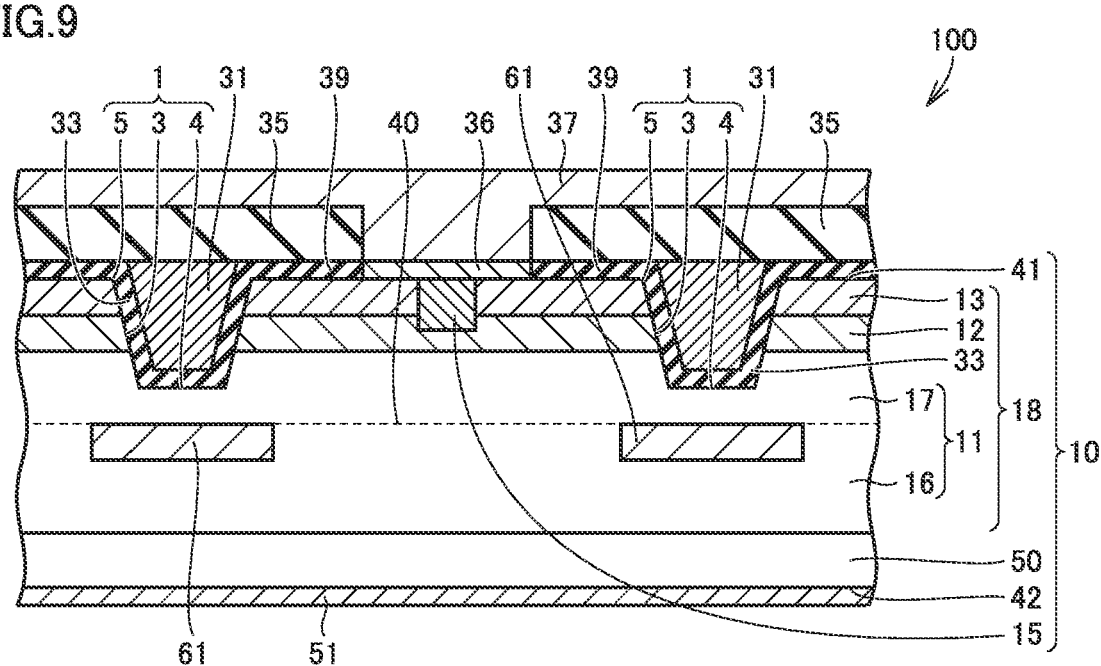
FIG. 9 is a schematic cross-sectional view taken along the line IX-IX in a direction of arrows in FIG. 7.

As shown in FIGS. 8 and 9, first portion 61 is located between first bottom surface 4 and second main surface 42. First portion 61 may be spaced from first bottom surface 4. Second drift layer 17 is provided between first portion 61 and first bottom surface 4. Third portion 63 is in contact with second impurity region 12. Third portion 63 is located between second bottom surface 7 and second main surface 42. Second impurity region 12 may be provided between third portion 63 and second bottom surface 7, or third portion 63 may be in contact with second bottom surface 7. As shown in FIG. 9, third portion 63 may not be provided between contact region 15 and second main surface 42. Likewise, third portion 63 may not be provided between source electrode 36 and second main surface 42.

A configuration of silicon carbide semiconductor device 100 according to a fourth variation of the present embodiment is now described. Silicon carbide semiconductor device 100 according to the fourth variation of the present embodiment is mainly different from silicon carbide semiconductor device 100 according to the third variation in that fourth impurity region 14 further has a second portion 62, and is otherwise similar in configuration to silicon carbide semiconductor device 100 according to the third variation.

Figure 10:
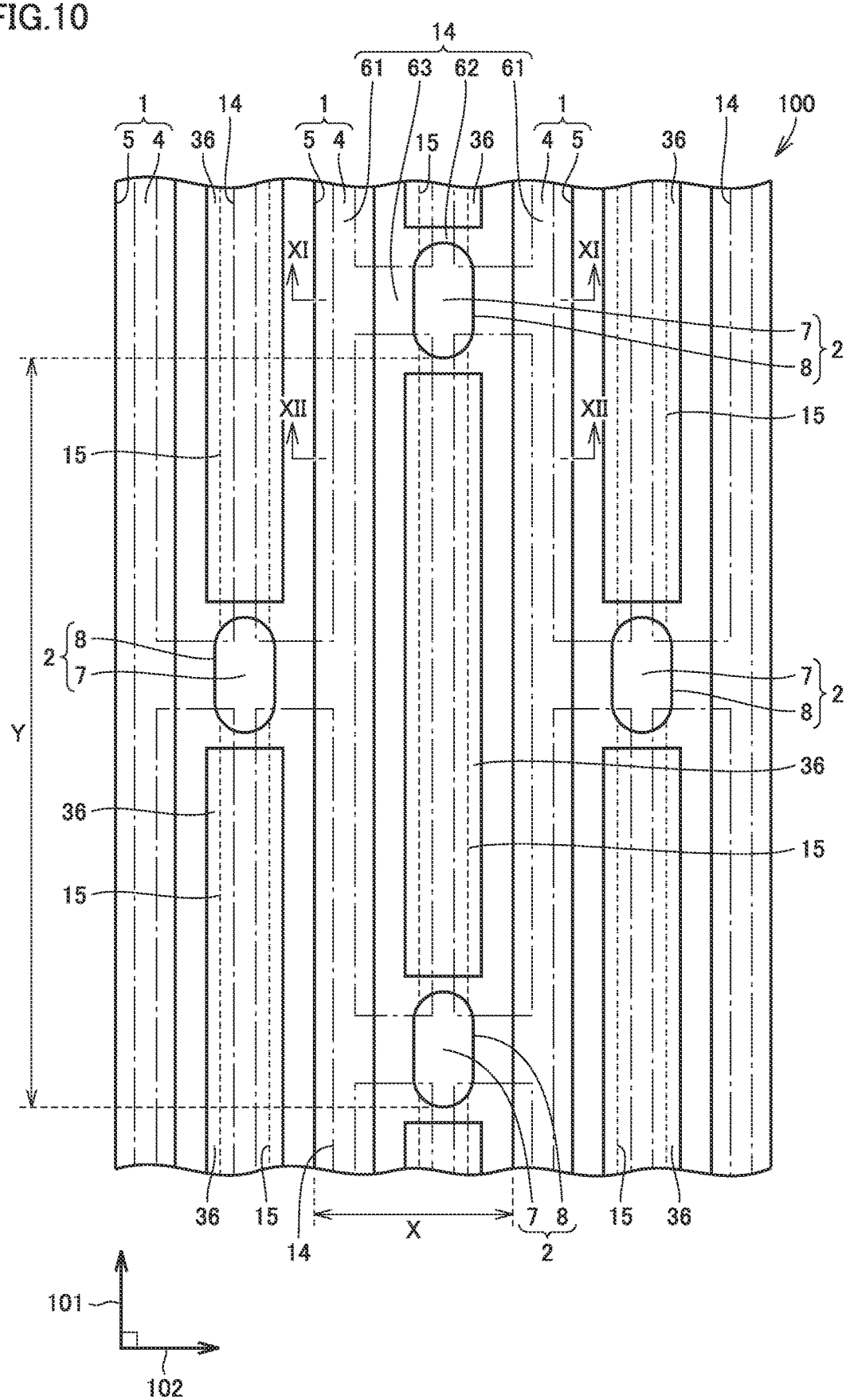
FIG. 10 is a schematic plan view showing a configuration of a silicon carbide semiconductor device according to a fourth variation of the present embodiment.

As shown in FIG. 10, as seen in the direction perpendicular to second main surface 42, fourth impurity region 14 may further have second portion 62 overlapping contact region 15. That is, fourth impurity region 14 may have first portion 61, second portion 62, and third portion 63. Second portion 62 is electrically connected to first portion 61. Second portion 62 is connected to first portion 61 with third portion 63 interposed therebetween.

Second portion 62 extends in the longitudinal direction of contact region 15. Stated from another perspective, second portion 62 extends in first direction 101. A longitudinal direction and a transverse direction of second portion 62 are first direction 101 and second direction 102, respectively. Second portion 62 may be disposed parallel to first portion 61. In second direction 102, the width of second portion 62 may be smaller than the width of contact region 15, or may be the same as the width of contact region 15. As seen in the direction perpendicular to second main surface 42, a part of second portion 62 may overlap second bottom surface 7 of second trench 2.

As shown in FIG. 10, in second direction 102, the width of first portion 61 may be smaller than the width of first opening 5 in first trench 1. In first direction 101, the width of first portion 61 may be greater than the width of second portion 62. In second direction 102, the width of second portion 62 may be smaller than the width of second opening 8 in second trench 2. In second direction 102, the width of second portion 62 may be smaller than the width of source electrode 36.

Figure 11:
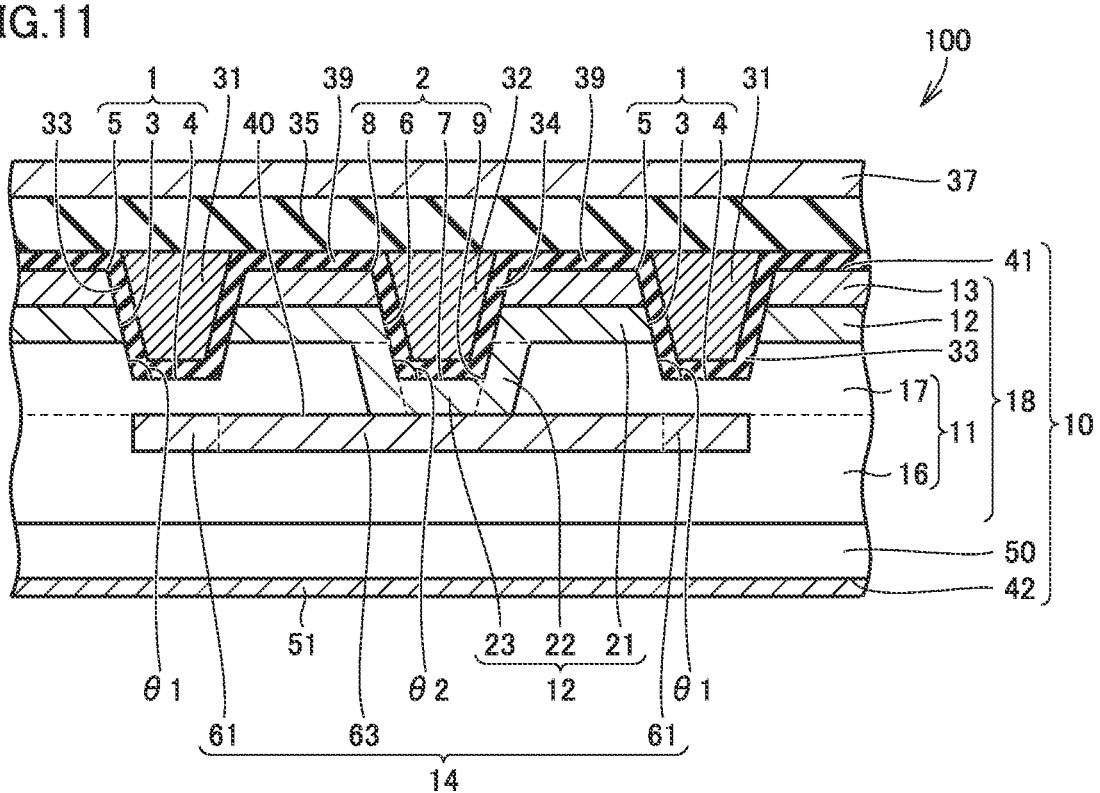
FIG. 11 is a schematic cross-sectional view taken along the line XI-XI in a direction of arrows in FIG. 10.
Figure 12:
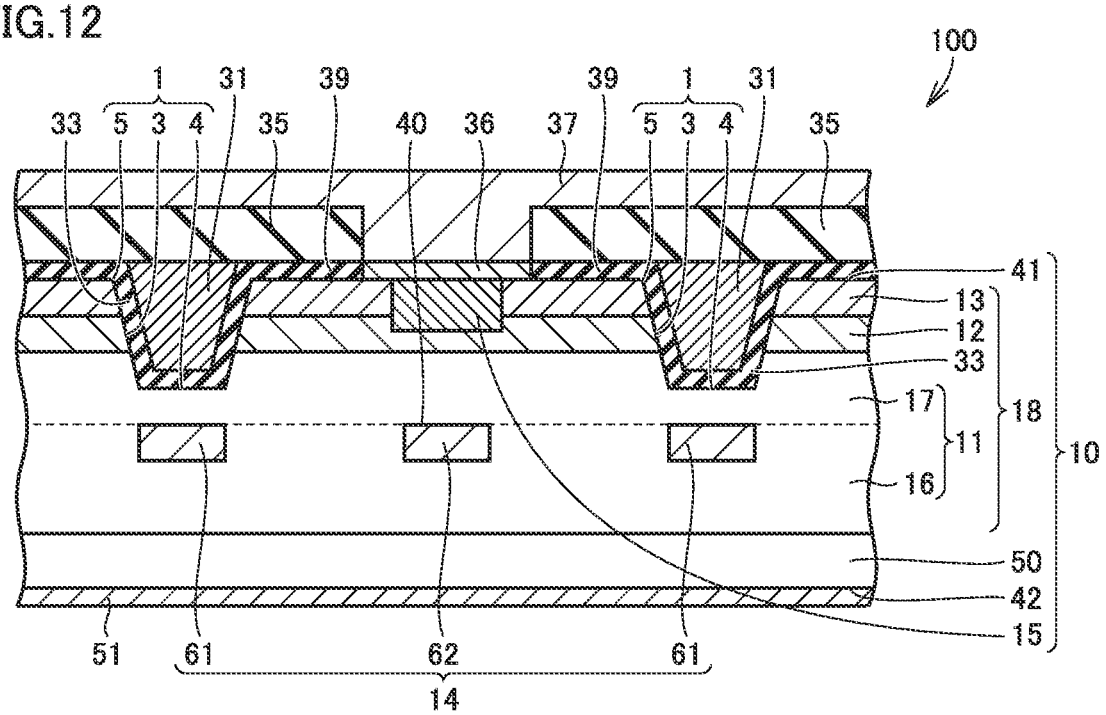
FIG. 12 is a schematic cross-sectional view taken along the line XII-XII in a direction of arrows in FIG. 10.

As shown in FIGS. 11 and 12, first portion 61 is provided between first bottom surface 4 and second main surface 42. Second drift layer 17 is provided between first portion 61 and first bottom surface 4. Second portion 62 is provided between contact region 15 and second main surface 42. Likewise, second portion 62 is provided between source electrode 36 and second main surface 42. Third portion 63 is in contact with second impurity region 12. Third portion 63 is provided between second bottom surface 7 and second main surface 42.

A configuration of silicon carbide semiconductor device 100 according to a fifth variation of the present embodiment is now described.

Figure 13:
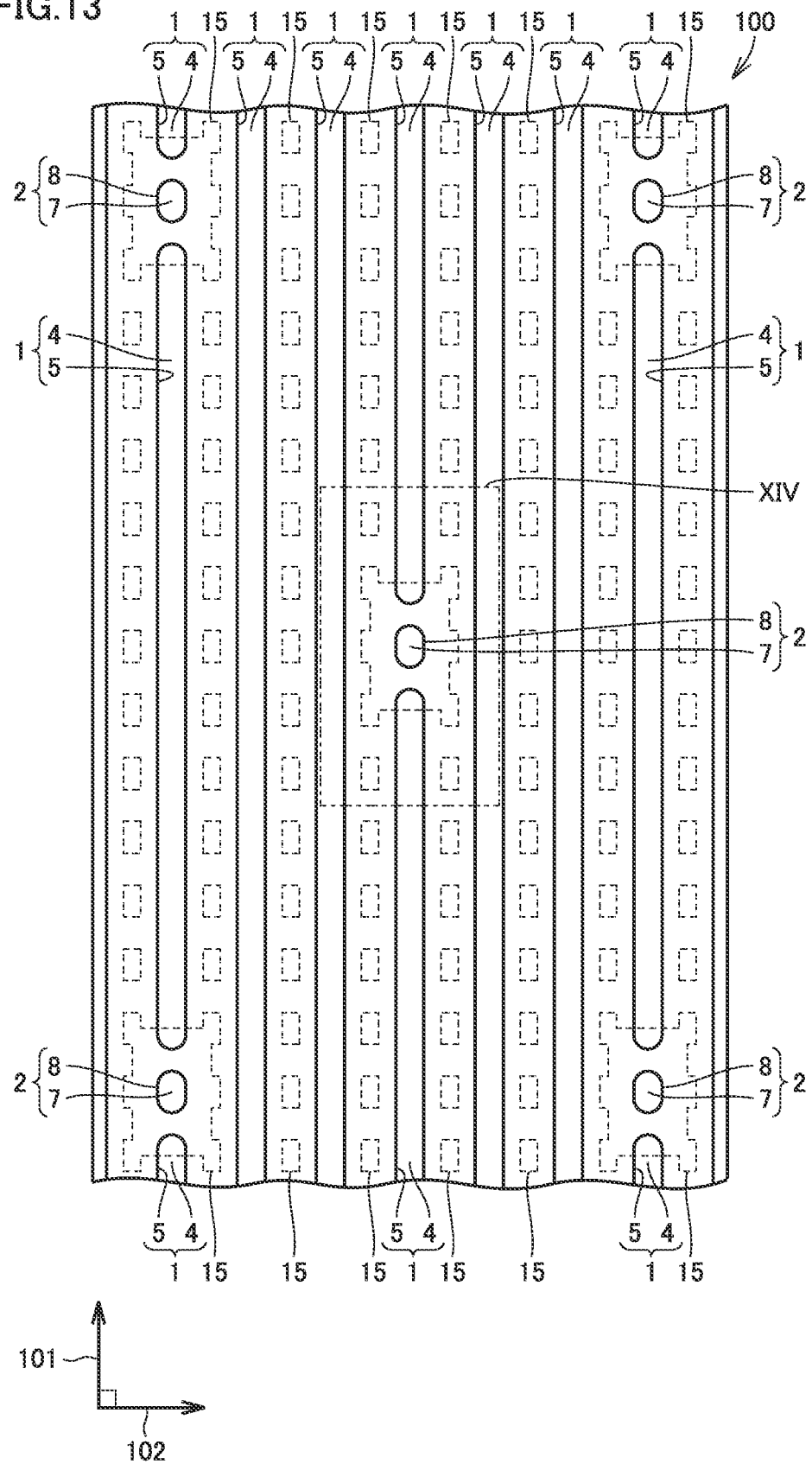
FIG. 13 is a schematic plan view showing a configuration of a silicon carbide semiconductor device according to a fifth variation of the present embodiment.

As shown in FIG. 13, as seen in the direction perpendicular to second main surface 42, second trench 2 may be provided next to first trench 1 in first direction 101. First trench 1 extends in first direction 101 parallel to second main surface 42. In other words, the longitudinal direction of first trench 1 is first direction 101. A plurality of first trenches 1 are aligned in second direction 102 which is the transverse direction of first trench 1. In second direction 102, one second trench 2 is provided for every plurality of first trenches 1. In first direction 101, first trenches 1 and second trenches 2 may be alternately provided. The plurality of contact regions 15 are provided at a distance from one another in first direction 101. Likewise, the plurality of contact regions 15 are provided at a distance from one another in second direction 102.

Figure 14:
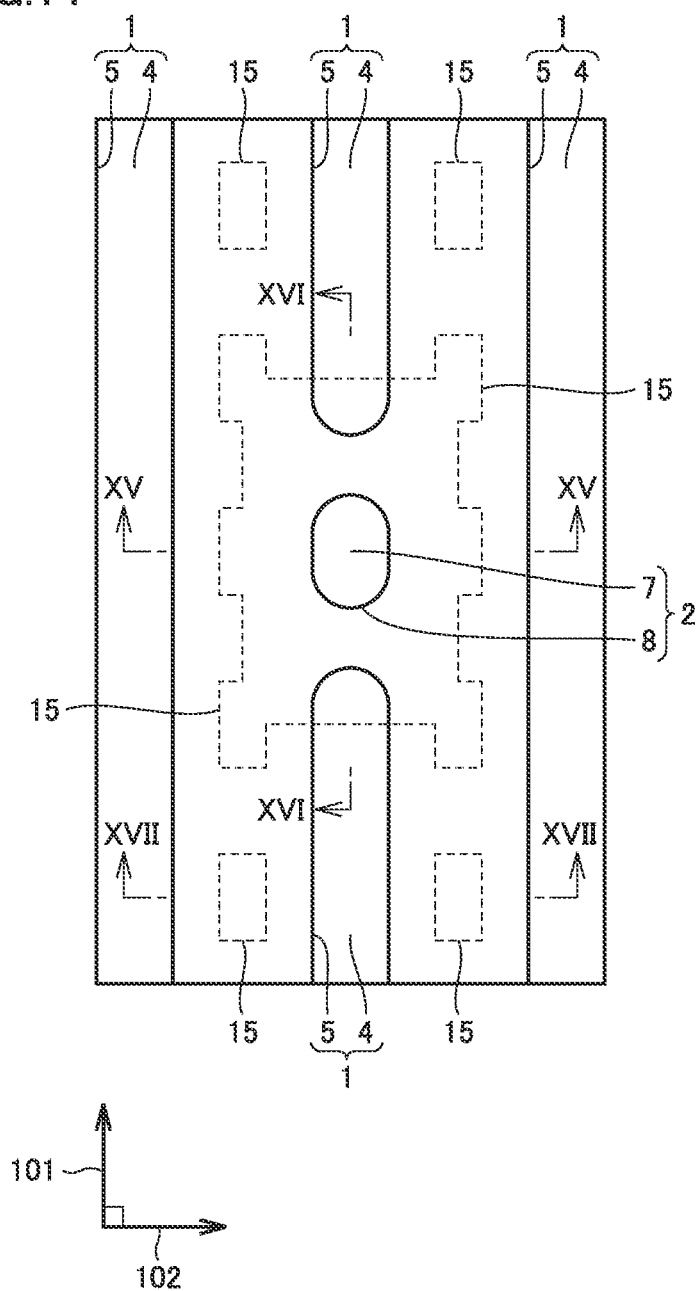
FIG. 14 is a schematic enlarged view of a region XIV in FIG. 13.

As shown in FIG. 14, as seen in the direction perpendicular to second main surface 42, second trench 2 may be surrounded by contact region 15. Specifically, second opening 8 in second trench 2 may be formed by contact region 15. As seen in the direction perpendicular to second main surface 42, a distance between second trench 2 and first trench 1 in first direction 101 may be shorter than a distance between second trench 2 and first trench 1 in second direction 102.

Figure 15:
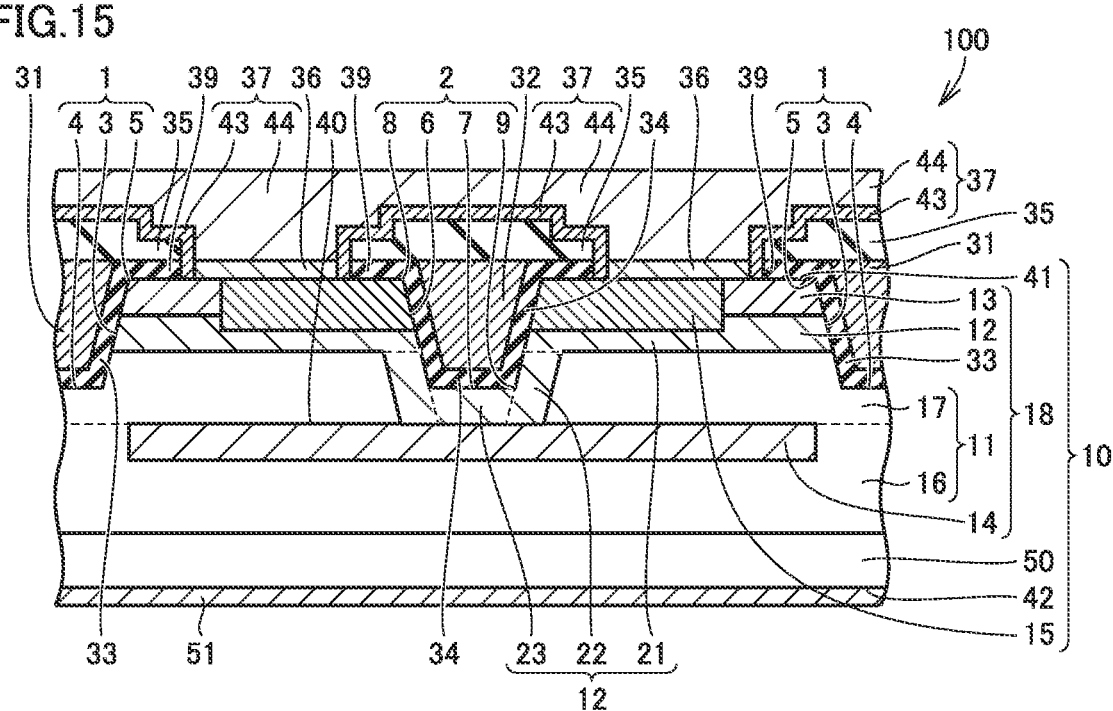
FIG. 15 is a schematic cross-sectional view taken along the line XV-XV in a direction of arrows in FIG. 14.

As shown in FIG. 15, a part of second side surface 6 and a part of first main surface 41 are formed by contact region 15. Second side surface 6 is formed by contact region 15 and second impurity region 12. Second bottom surface 7 is formed by second impurity region 12. Stated from another perspective, each of second side surface 6 and second bottom surface 7 is formed by a p type impurity region. Contact region 15 and second impurity region 12 are in contact with second insulating film 34 at second side surface 6. Second impurity region 12 is in contact with second insulating film 34 at second bottom surface 7. Contact region 15 is in contact with third insulating film 39 at first main surface 41.

Figure 16:
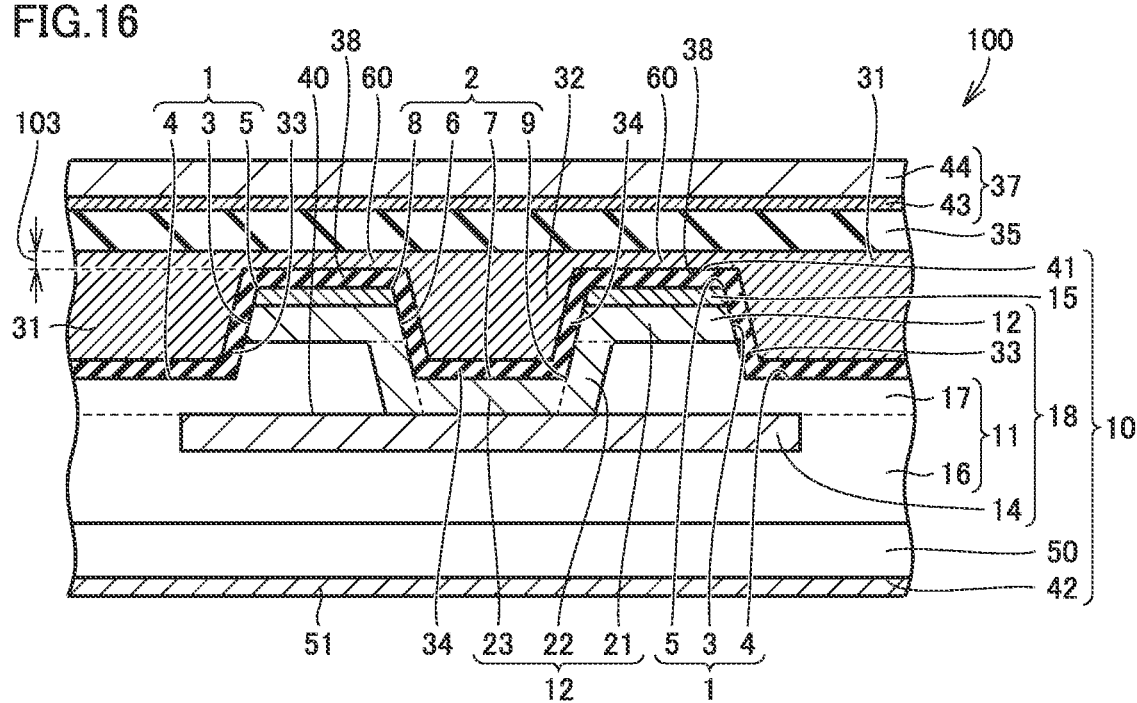
FIG. 16 is a schematic cross-sectional view taken along the line XVI-XVI in a direction of arrows in FIG. 14.

As shown in FIG. 16, a fourth insulating film 38 is provided on first main surface 41. Fourth insulating film 38 is continuous with each of first insulating film 33 and second insulating film 34. Fourth insulating film 38 is provided between first insulating film 33 and second insulating film 34. A conductive film 60 is provided on fourth insulating film 38. Conductive film 60 is continuous with each of gate electrode 31 and filling portion 32. Conductive film 60 is provided between gate electrode 31 and filling portion 32. Conductive film 60 has a thickness 103 of not less than 300 nm and not more than 400 nm, for example.

As described above, filling portion 32 may be electrically connected to gate electrode 31. In this case, it is desirable that second side surface 6 and second bottom surface 7 be formed by a p type impurity region. When second side surface 6 and second bottom surface 7 are partially formed by an n type impurity region, a leak current may be generated between the n type impurity region and filling portion 32 with second insulating film 34 interposed therebetween. In contrast, when second side surface 6 and second bottom surface 7 are formed by a p type impurity region, the generation of a leak current can be suppressed between the p type impurity region and filling portion 32 with second insulating film 34 interposed therebetween, because the p type impurity region does not have tunneling electrons.

As shown in FIG. 16, a part of first main surface 41 is formed by contact region 15. Contact region 15 is in contact with fourth insulating film 38 at first main surface 41. Fourth insulating film 38 is provided between conductive film 60 and contact region 15. Conductive film 60 is in contact with each of fourth insulating film 38 and interlayer insulating film 35. Conductive film 60 is provided between fourth insulating film 38 and interlayer insulating film 35.

As shown in FIGS. 15 and 16, source wire 37 may have a first wire layer 43 and a second wire layer 44. First wire layer 43 is provided on interlayer insulating film 35. Second wire layer 44 is provided on first wire layer 43. As shown in FIG. 15, a part of first wire layer 43 may be in contact with first main surface 41. Source electrode 36 may be in contact with first wire layer 43. Interlayer insulating film 35 is separated from second wire layer 44 by first wire layer 43. First wire layer 43 is made of titanium nitride (TiN), for example. Second wire layer 44 is made of a material including aluminum, for example.

As shown in FIG. 15, fourth impurity region 14 faces second bottom surface 7 of second trench 2. Fourth impurity region 14 extends in second direction 102 (see FIG. 14). Fourth impurity region 14 extends to portions in the vicinity of first trenches 1 located on opposite sides of second trench 2 in second direction 102. Fourth impurity region 14 may not face first bottom surfaces 4 of first trenches 1 located on opposite sides of second trench 2 in second direction 102. Fourth impurity region 14 may face second impurity region 12, contact region 15, and source region 13.

As shown in FIG. 16, fourth impurity region 14 extends in first direction 101 (see FIG. 14). Fourth impurity region 14 extends to portions in the vicinity of first trenches 1 located on opposite sides of second trench 2 in first direction 101. Fourth impurity region 14 may face first bottom surfaces 4 and first side surfaces 3 of first trenches 1 located on opposite sides of second trench 2 in first direction 101. Fourth impurity region 14 may face fourth insulating film 38 and conductive film 60.

Figure 17:
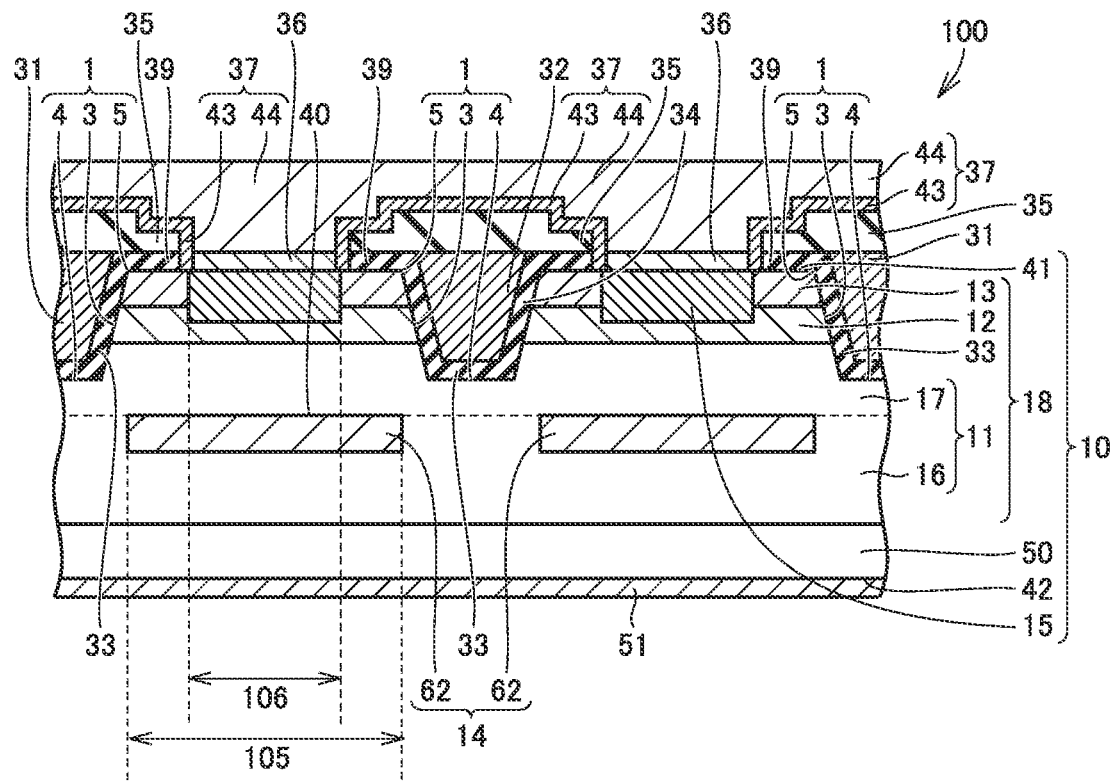
FIG. 17 is a schematic cross-sectional view taken along the line XVII-XVII in a direction of arrows in FIG. 14.

As shown in FIG. 17, fourth impurity region 14 may have second portion 62 that does not face first bottom surface 4 of first trench 1 and faces contact region 15. Stated from another perspective, as seen in the direction perpendicular to second main surface 42, second portion 62 may be provided between two first trenches 1 adjacent to each other in second direction 102. First drift layer 16 may be provided between two second portions 62 adjacent to each other in second direction 102. In second direction 102, a width 105 of second portion 62 may be greater than a width 106 of contact region 15.

A configuration of silicon carbide semiconductor device 100 according to a sixth variation of the present embodiment is now described. Silicon carbide semiconductor device 100 according to the sixth variation of the present embodiment is different from silicon carbide semiconductor device 100 according to the fifth variation in the configuration of fourth impurity region 14, and is otherwise similar in configuration to silicon carbide semiconductor device 100 according to the fifth variation.

Figure 18:
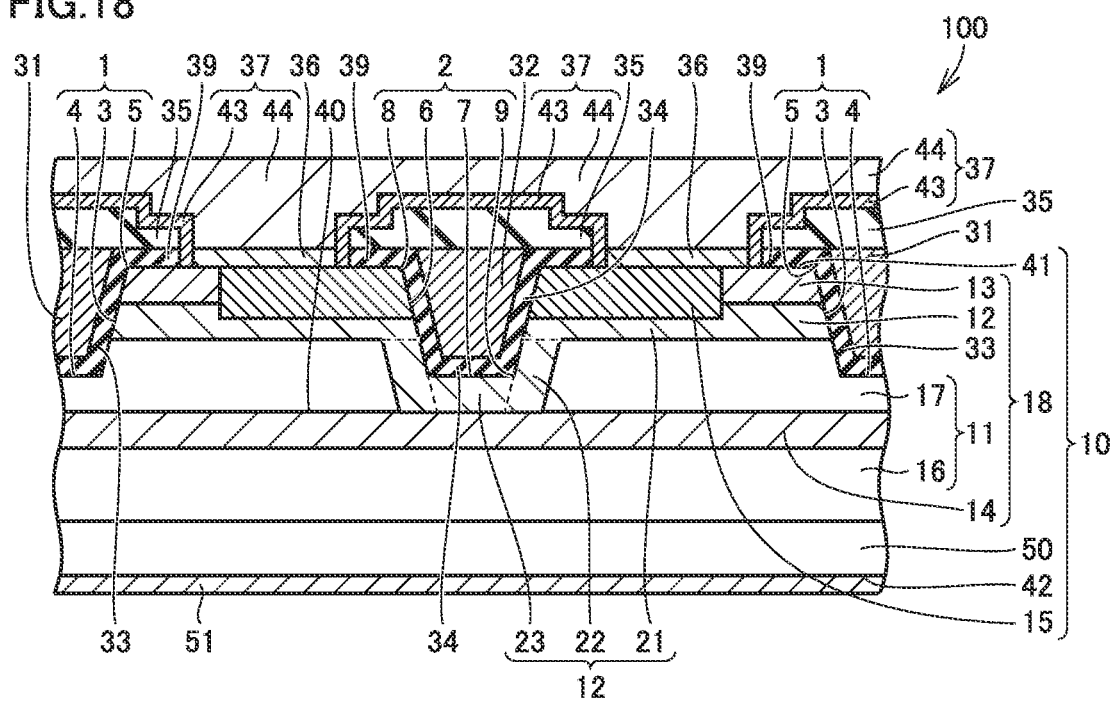
FIG. 18 is a schematic cross-sectional view showing a configuration of a silicon carbide semiconductor device according to a sixth variation of the present embodiment, and corresponds to a portion taken along the line XV-XV in FIG. 14.

As shown in FIG. 18, fourth impurity region 14 may extend in second direction 102 to face first bottom surfaces 4 and first side surfaces 3 of first trenches 1 located on opposite sides of second trench 2 in second direction 102. Fourth impurity region 14 may extend to traverse first trenches 1 adjacent to second trench 2 in second direction 102 and face first bottom surfaces 4 of further adjacent first trenches 1.

Figure 19:
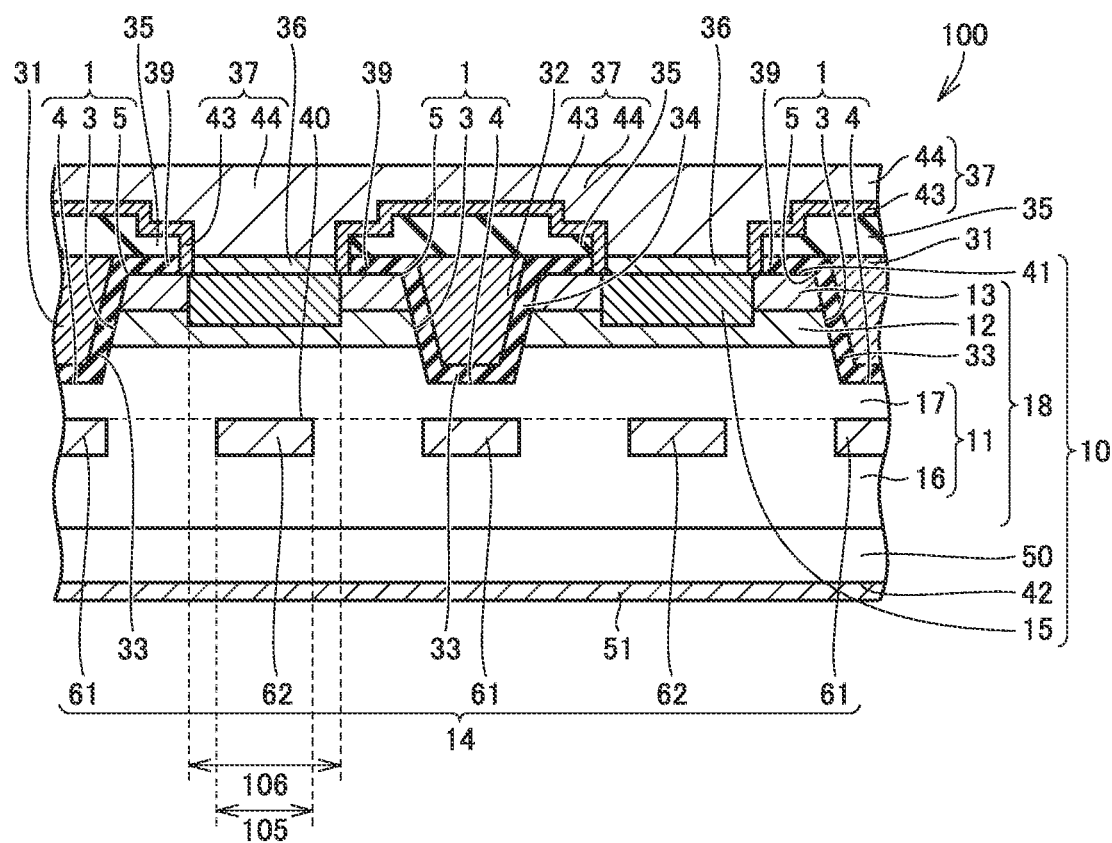
FIG. 19 is a schematic cross-sectional view showing the configuration of the silicon carbide semiconductor device according to the sixth variation of the present embodiment, and corresponds to a portion taken along the line XVII-XVII in FIG. 14.

As shown in FIG. 19, fourth impurity region 14 may have first portion 61 facing first bottom surface 4 of first trench 1, and second portion 62 facing contact region 15. Stated from another perspective, as seen in the direction perpendicular to the second main surface, fourth impurity region 14 may have first portion 61 overlapping first bottom surface 4, and second portion 62 overlapping contact region 15. Second portion 62 may be electrically connected to first portion 61. First portions 61 and second portions 62 may be alternately provided in second direction 102. First drift layer 16 may be provided between first portion 61 and second portion 62 adjacent to each other in second direction 102. In second direction 102, width 105 of second portion 62 may be smaller than width 106 of contact region 15. In this case, a current path is increased, thereby allowing a reduction in on resistance. In second direction 102, width 105 of second portion 62 may be greater than width 106 of contact region 15. In this case, electric field concentration can be relaxed at end portions of second portion 62, thereby allowing an increase in breakdown voltage.

A configuration of silicon carbide semiconductor device 100 according to a seventh variation of the present embodiment is now described. Silicon carbide semiconductor device 100 according to the seventh variation of the present embodiment is different from silicon carbide semiconductor device 100 according to the sixth variation in the configuration of fourth impurity region 14, and is otherwise similar in configuration to silicon carbide semiconductor device 100 according to the sixth variation.

Figure 20:
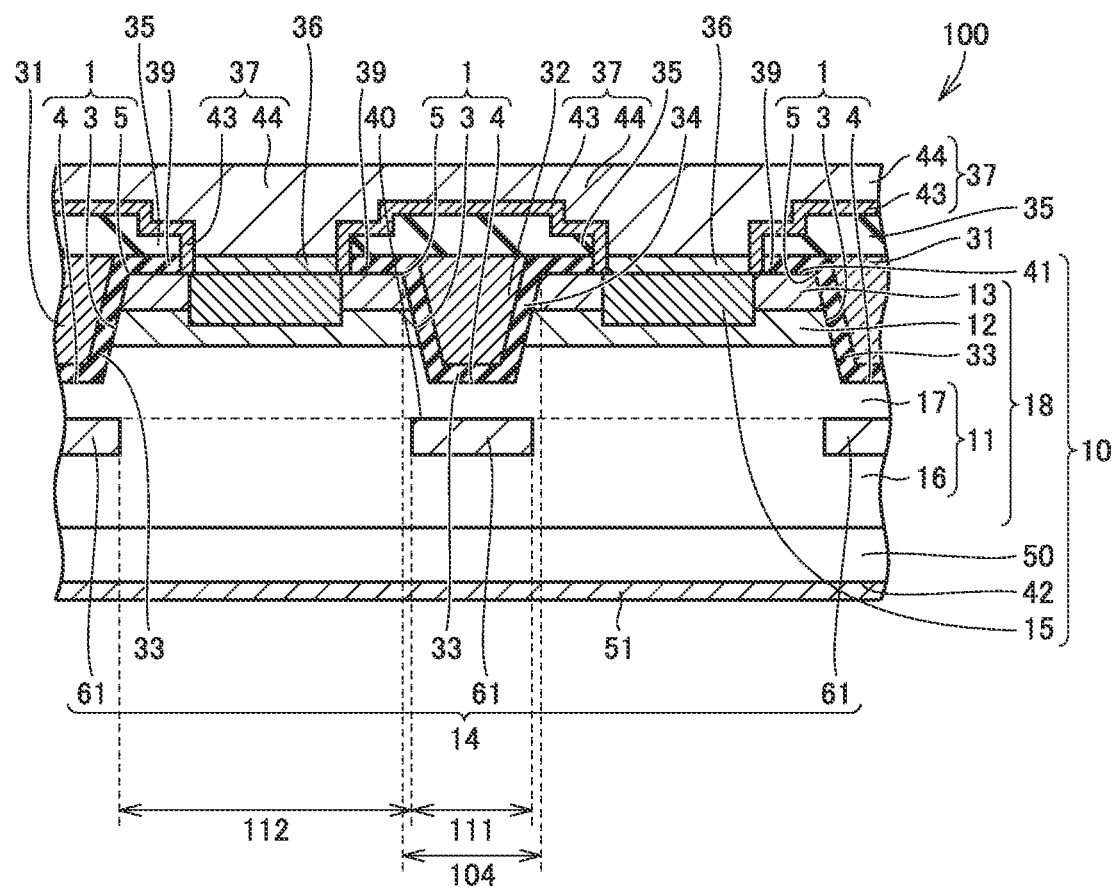
FIG. 20 is a schematic cross-sectional view showing a configuration of a silicon carbide semiconductor device according to a seventh variation of the present embodiment, and corresponds to the portion taken along the line XVII-XVII in FIG. 14.

As shown in FIG. 20, fourth impurity region 14 may have first portion 61 facing first bottom surface 4 of first trench 1, and not face contact region 15. Stated from another perspective, as seen in the direction perpendicular to second main surface 42, fourth impurity region 14 has first portion 61 overlapping first bottom surface 4, and does not overlap contact region 15. A plurality of first portions 61 may be provided at a distance from one another in second direction 102. First drift layer 16 may be provided between first portions 61 adjacent to each other in second direction 102. In second direction 102, a width 111 of first portion 61 may be smaller than a width 104 of first opening 5. In this case, a current path is increased, thereby allowing a reduction in on resistance. In second direction 102, width 111 of first portion 61 may be greater than width 104 of first opening 5. In this case, electric field concentration can be relaxed at end portions of first portion 61, thereby allowing an increase in breakdown voltage. In second direction 102, an interval 112 between two adjacent first portions 61 may be greater than width 111 of first portion 61.

A method of manufacturing MOSFET 100 according to the present embodiment is now described.

Figure 21:
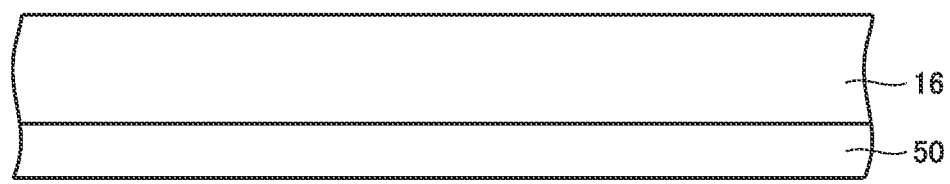
FIG. 21 is a schematic cross-sectional view showing a first step of a method of manufacturing the silicon carbide semiconductor device according to the present embodiment.

First, a step of preparing a silicon carbide substrate is performed. Silicon carbide single-crystal substrate 50 is prepared by slicing of a silicon carbide ingot (not shown) manufactured, for example, by a sublimation process. Then, a step of forming first drift layer 16 is performed. First drift layer 16 is formed on silicon carbide single-crystal substrate 50 (see FIG. 21) by a chemical vapor deposition (CVD) process using, for example, a mixed gas of silane ($SiH_4$) and propane ($C_3H_8$) as a source material gas, and using, for example, hydrogen ($H_2$) as a carrier gas. During epitaxial growth, an n type impurity such as nitrogen is introduced into first drift layer 16. First drift layer 16 has n type conductivity.

Figure 22:
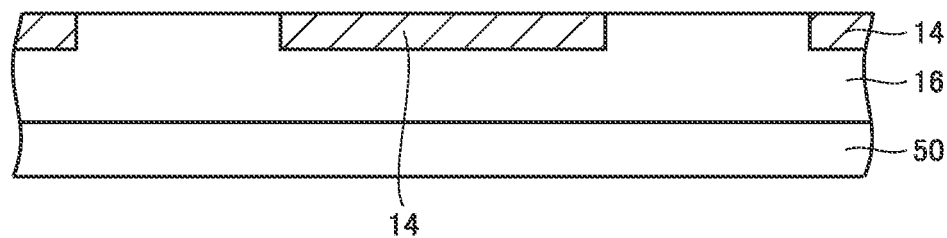
FIG. 22 is a schematic cross-sectional view showing a second step of the method of manufacturing the silicon carbide semiconductor device according to the present embodiment.

Then, a step of forming a fourth impurity region is performed. For example, a mask layer (not shown) is formed that has an opening over a region where fourth impurity region 14 is to be formed. Then, a p type impurity such as aluminum is implanted into first drift layer 16. Fourth impurity region 14 is thereby formed (see FIG. 22). Fourth impurity region 14 is formed to be in contact with first drift layer 16 and to be exposed at a surface of first drift layer 16.

Then, a step of forming a second drift layer is performed. Second drift layer 17 is formed on first drift layer 16 by a CVD process using, for example, a mixed gas of silane and propane as a source material gas, and using, for example, hydrogen as a carrier gas. During epitaxial growth, an n type impurity such as nitrogen is introduced into second drift layer 17. Second drift layer 17 has n type conductivity. Second drift layer 17 is in contact with each of fourth impurity region 14 and first drift layer 16.

Figure 23:
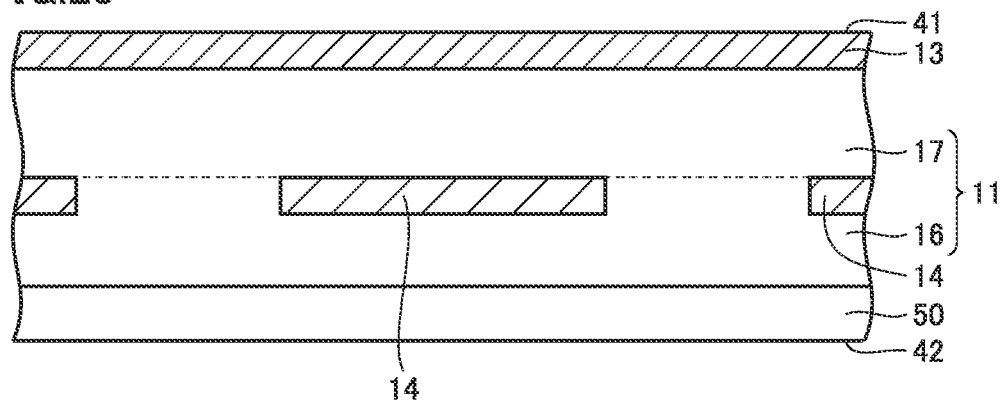
FIG. 23 is a schematic cross-sectional view showing a third step of the method of manufacturing the silicon carbide semiconductor device according to the present embodiment.

Then, a step of forming a source region is performed. Ions of an n type impurity such as phosphorus (P) are implanted into the entire surface of second drift layer 17. Source region 13 is thereby formed. Source region 13 is formed to be in contact with second drift layer 17 and to be exposed at a surface of second drift layer 17 (see FIG. 23). Source region 13 forms first main surface 41. Then, a step of forming a contact region is performed. For example, a mask layer (not shown) is formed that has an opening over a region where contact region 15 is to be formed. Then, a p type impurity such as aluminum is implanted into source region 13. Contact region 15 in contact with source region 13 (see FIG. 2) is thereby formed.

Then, a step of forming a second trench is performed. Specifically, a mask (not shown) is formed that has an opening over a position where second trench 2 (see FIG. 1) is to be formed. Using the mask, a part of source region 13 and a part of drift region 11 are removed by etching. Examples of an etching process that can be employed include reactive ion etching, and particularly, inductively coupled plasma reactive ion etching. Specifically, inductively coupled plasma reactive ion etching using, for example, sulfur hexafluoride ($SF_6$) or a mixed gas of $SF_6$ and oxygen ($O_2$) as a reactive gas can be employed. The etching forms, in a region where second trench 2 is to be formed, a recess having a side substantially perpendicular to first main surface 41, and a bottom provided continuously with the side and substantially parallel to first main surface 41.

Then, thermal etching is performed in the recess. The thermal etching may be performed, for example, by heating in an atmosphere including a reactive gas having at least one or more types of halogen atoms, with the mask formed on first main surface 41. The at least one or more types of halogen atoms include at least one of chlorine (Cl) atoms and fluorine (F) atoms. This atmosphere includes chlorine ($Cl_2$), boron trichloride ($BCl_3$), $SF_6$ or carbon tetrafluoride ($CF_4$), for example. The thermal etching is performed using, for example, a mixed gas of chlorine gas and oxygen gas as the reactive gas, at a heat treatment temperature of not less than 800° C. and not more than 900° C., for example. The reactive gas may include a carrier gas, in addition to the chlorine gas and the oxygen gas described above. Examples of the carrier gas that can be used include nitrogen gas, argon gas and helium gas.

Figure 24:
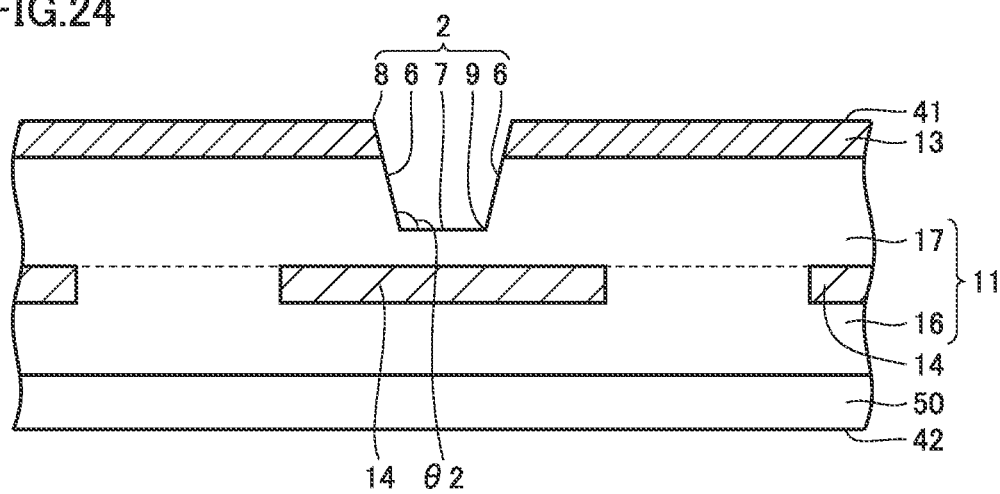
FIG. 24 is a schematic cross-sectional view showing a fourth step of the method of manufacturing the silicon carbide semiconductor device according to the present embodiment.

The thermal etching described above forms second trench 2 in first main surface 41 (see FIG. 24). Second trench 2 is defined by second side surface 6 and second bottom surface 7. Second side surface 6 is formed by source region 13 and drift region 11. Second bottom surface 7 is formed by drift region 11. Second angle θ2 formed between second side surface 6 and second bottom surface 7 is not less than 115° and not more than 135°, for example. The mask is then removed from first main surface 41.

Figure 25:
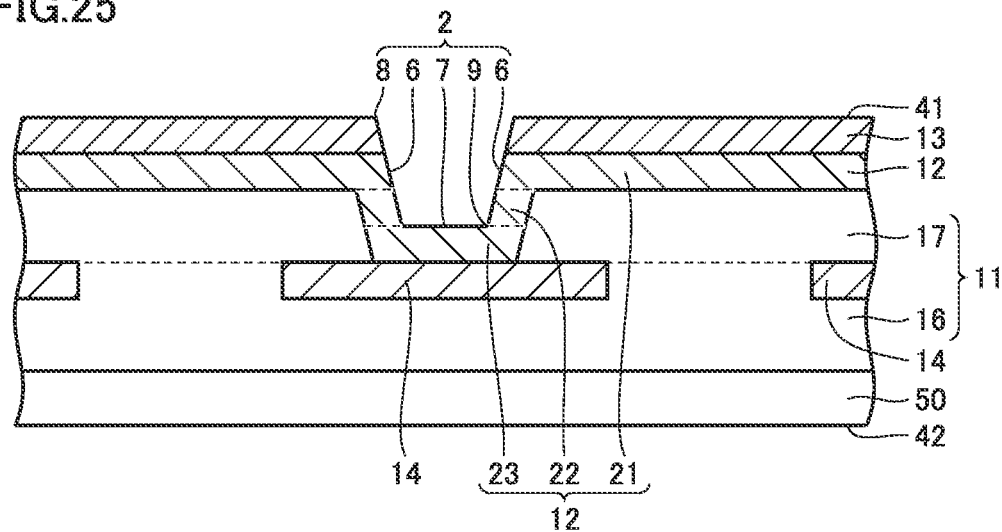
FIG. 25 is a schematic cross-sectional view showing a fifth step of the method of manufacturing the silicon carbide semiconductor device according to the present embodiment.

Then, a step of forming a second impurity region is performed. A p type impurity such as aluminum is implanted into the entire first main surface 41 toward second drift layer 17. Second impurity region 12 in contact with fourth impurity region 14 is thereby formed (see FIG. 25). Second impurity region 12 includes body region 21, first connection region 22, and second connection region 23. Body region 21 is formed to be in contact with source region 13. First connection region 22 is formed to be exposed at second side surface 6 of second trench 2. Second connection region 23 is formed to be exposed at second bottom surface 7.

Then, activation annealing is performed in order to activate the impurity ions that have been implanted into silicon carbide substrate 10. The activation annealing is performed preferably at a temperature of not less than 1500° C. and not more than 1900° C., for example, about 1700° C. The activation annealing is performed for a period of about 30 minutes, for example. The activation annealing is performed preferably in an inert gas atmosphere, for example, an Ar atmosphere.

Then, a step of forming a first trench is performed. Specifically, a mask (not shown) is formed that has an opening over a positon where first trench 1 (see FIG. 1) is to be formed. Using the mask, a part of source region 13, a part of body region 21, and a part of drift region 11 are removed by etching. Examples of an etching process that can be employed include reactive ion etching, and particularly, inductively coupled plasma reactive ion etching. Specifically, inductively coupled plasma reactive ion etching using, for example, sulfur hexafluoride ($SF_6$) or a mixed gas of $SF_6$ and oxygen ($O_2$) as a reactive gas can be employed. The etching forms, in a region where first trench 1 is to be formed, a recess having a side substantially perpendicular to first main surface 41, and a bottom provided continuously with the side and substantially parallel to first main surface 41.

Then, thermal etching is performed in the recess. The thermal etching may be performed, for example, by heating in an atmosphere including a reactive gas having at least one or more types of halogen atoms, with the mask formed on first main surface 41. The at least one or more types of halogen atoms include at least one of chlorine atoms and fluorine atoms. This atmosphere includes chlorine, boron trichloride, $SF_6$ or carbon tetrafluoride, for example. The thermal etching is performed using, for example, a mixed gas of chlorine gas and oxygen gas as the reactive gas, at a heat treatment temperature of not less than 800° C. and not more than 900° C., for example. The reactive gas may include a carrier gas, in addition to the chlorine gas and the oxygen gas described above. Examples of the carrier gas that can be used include nitrogen gas, argon gas and helium gas.

Figure 26:
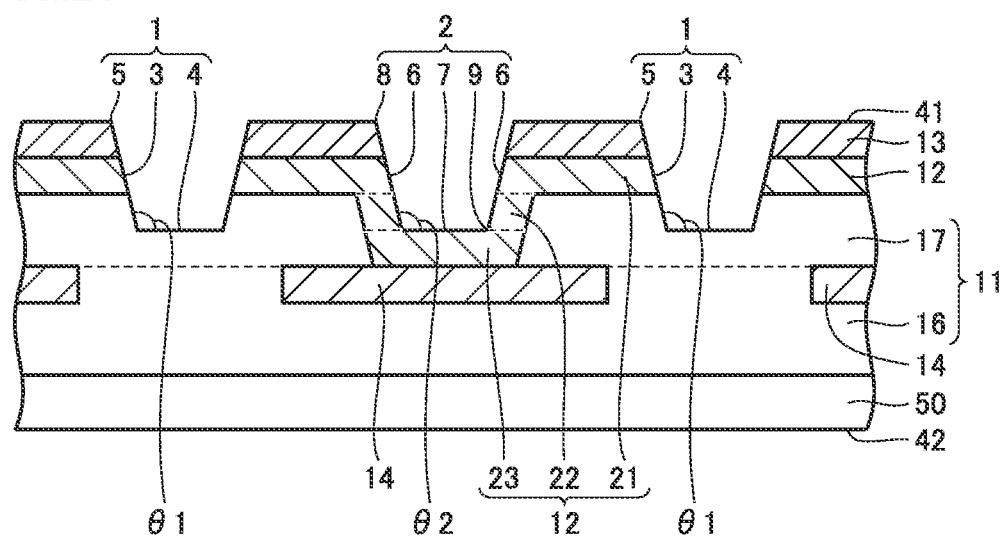
FIG. 26 is a schematic cross-sectional view showing a sixth step of the method of manufacturing the silicon carbide semiconductor device according to the present embodiment.

The thermal etching described above forms first trench 1 in first main surface 41 (see FIG. 26). First trench 1 is defined by first side surface 3 and first bottom surface 4. First side surface 3 is formed by source region 13, body region 21 and drift region 11. First bottom surface 4 is formed by drift region 11. First angle θ1 formed between first side surface 3 and first bottom surface 4 is not less than 115° and not more than 135°, for example. The mask is then removed from first main surface 41.

Then, a step of forming an insulating film is performed. First insulating film 33, second insulating film 34 and third insulating film 39 are formed, for example, by thermal oxidation of silicon carbide substrate 10. Specifically, silicon carbide substrate 10 is heated at a temperature of not less than 1300° C. and not more than 1400° C., for example, in an atmosphere including oxygen. First insulating film 33 in contact with each of first side surface 3 and first bottom surface 4, second insulating film 34 in contact with each of second side surface 6 and second bottom surface 7, and third insulating film 39 in contact with first main surface 41 are thereby formed.

Then, silicon carbide substrate 10 may be subjected to heat treatment (NO annealing) in a nitrogen monoxide (NO) gas atmosphere. In the NO annealing, silicon carbide substrate 10 is held for about one hour under the condition of not less than 1100° C. and not more than 1400° C., for example. Nitrogen atoms are thereby introduced into an interface region between first insulating film 33 and body region 21. As a result, the formation of an interface state in the interface region is suppressed, thereby allowing improvement in channel mobility.

After the NO annealing, Ar annealing using argon (Ar) as an atmospheric gas may be performed. The Ar annealing is performed at a heating temperature equal to or higher than the heating temperature for the NO annealing described above. The Ar annealing is performed for a period of about one hour, for example. The formation of an interface state in the interface region between first insulating film 33 and body region 21 is thereby further suppressed. As the atmospheric gas, another inert gas such as nitrogen gas may be used instead of the Ar gas.

Then, a step of forming a gate electrode and a filling portion is performed. Gate electrode 31 is formed on first insulating film 33. Filling portion 32 is formed on second insulating film 34. Gate electrode 31 and filling portion 32 are formed by a low pressure chemical vapor deposition (LP-CVD) process, for example. Gate electrode 31 and filling portion 32 are made of polysilicon containing a conductive impurity, for example. Gate electrode 31 is formed to fill at least a part of first trench 1. Filling portion 32 is formed to fill at least a part of second trench 2. An upper surface of gate electrode 31 is thereby rendered substantially flush with an upper surface of filling portion 32.

Then, a step of forming an interlayer insulating film is performed. Interlayer insulating film 35 is formed by a CVD process, for example. Interlayer insulating film 35 is a material including silicon dioxide, for example. Interlayer insulating film 35 is formed to cover gate electrode 31, filling portion 32, first insulating film 33, second insulating film 34, and third insulating film 39.

Then, a step of forming a source electrode is performed. A part of interlayer insulating film 35 and a part of third insulating film 39 are removed by etching so as to expose source region 13 and contact region 15. Then, source electrode 36 in contact with source region 13 and contact region 15 at first main surface 41 is formed. Source electrode 36 is formed by a sputtering process, for example. Source electrode 36 is made of a material including Ti, Al and Si, for example.

Then, alloying annealing is performed. Source electrode 36 in contact with source region 13 and contact region 15 is held for about five minutes at a temperature of not less than 900° C. and not more than 1100° C., for example. At least a part of source electrode 36 thereby reacts with silicon included in silicon carbide substrate 10, and is silicided. Source electrode 36 in ohmic contact with source region 13 is thereby formed. Source electrode 36 may be in ohmic contact with contact region 15. Then, source wire 37 is formed. Source wire 37 is made of a material including aluminum, for example. Source wire 37 is formed to be in contact with source electrode 36, and to cover interlayer insulating film 35.

Then, a step of forming a drain electrode is performed. Drain electrode 51 in contact with second main surface 42 is formed by a sputtering process, for example. Drain electrode 51 is made of a material including NiSi or TiAlSi, for example. In this manner, MOSFET 100 according to the present embodiment (see FIGS. 1 and 2) is completed.

Although n type has been described as the first conductivity type and p type has been described as the second conductivity type in the embodiment, p type may be the first conductivity type and n type may be the second conductivity type. In addition, although silicon carbide semiconductor device 100 has been described with reference to a MOSFET as an example in the embodiment, silicon carbide semiconductor device 100 may be, for example, an insulated gate bipolar transistor (IGBT). The concentration of a p type impurity and the concentration of an n type impurity in each impurity region described above can be measured, for example, with a scanning capacitance microscope (SCM) or secondary ion mass spectrometry (SIMS). The position of a boundary surface between a p type region and an n type region (that is, a PN interface) can be identified, for example, with a SCM or SIMS.

Functions and effects of the silicon carbide semiconductor device according to the present embodiment will now be described.

According to silicon carbide semiconductor device 100 according to the present embodiment, first main surface 41 is provided with first trench 1 and second trench 2. Second impurity region 12 has connection region 22 electrically connected to fourth impurity region 14 and extending toward fourth impurity region 14 along second side surface 6 of second trench 2.

When first main surface 41 is provided with second trench 2, connection region 22 can be formed by ion implantation into the entire first main surface 41 without the use of an implantation mask. Thus, fourth impurity region 14 can be connected to second impurity region 12 by a simple process. As a result, switching characteristics of the silicon carbide semiconductor device can be improved as compared to an example where fourth impurity region 14 is not connected to second impurity region 12 (that is, when fourth impurity region 14 is floating).

According to silicon carbide semiconductor device 100 according to the present embodiment, as seen in the direction perpendicular to second main surface 42, in each unit cell 120, the area of opening 8 in second trench 2 may be smaller than the area of opening 5 in first trench 1. By making the region where connection region 22 is formed smaller, a larger channel region can be ensured. As a result, on resistance can be reduced.

Furthermore, silicon carbide semiconductor device 100 according to the present embodiment may further include source electrode 36 electrically connected to third impurity region 13. As seen in the direction perpendicular to second main surface 42, in each unit cell 120, the area of source electrode 36 may be greater than the area of opening 8 in second trench 2. By making the region where connection region 22 is formed smaller, a larger area of source electrode 36 can be ensured. As a result, contact resistance between source electrode 36 and silicon carbide substrate 10 can be reduced.

Furthermore, according to silicon carbide semiconductor device 100 according to the present embodiment, as seen in the direction perpendicular to second main surface 42, the area of opening 8 in second trench 2 may be greater than the area of second bottom surface 7. Accordingly, connection region 22 can be formed without the use of oblique ion implantation.

Furthermore, silicon carbide semiconductor device 100 according to the present embodiment further includes filling portion 32 provided on second insulating film 34, and interlayer insulating film 35 covering each of gate electrode 31 and filling portion 32. Second trench 2 is thereby filled, so that the formation of a depression in interlayer insulating film 35 provided on second trench 2 can be suppressed. As a result, the formation of a cavity in source wire 37 provided on interlayer insulating film 35 can be suppressed.

Furthermore, according to silicon carbide semiconductor device 100 according to the present embodiment, as seen in the direction perpendicular to second main surface 42, first trench 1 may extend in first direction 101 parallel to second main surface 42, and second trench 2 may be provided next to first trench 1 in first direction 101. A cell pitch can thereby be reduced as compared to an example where second trench 2 is provided next to first trench 1 in second direction 102.

It should be understood that the embodiment disclosed herein is illustrative and non-restrictive in every respect. The scope of the present invention is defined by the terms of the claims rather than the description above, and is intended to include any modifications within the meaning and scope equivalent to the terms of the claims.

REFERENCE SIGNS LIST 1 first trench; 2 second trench; 3 first side surface; 4 first bottom surface; 5 opening (first opening); 6 second side surface; 7 second bottom surface; 8 opening (second opening); 9 boundary portion; 10 silicon carbide substrate; 11 first impurity region (drift region); 12 second impurity region; 13 third impurity region (source region); 14 fourth impurity region; 15 fifth impurity region (contact region); 16 first drift layer; 17 second drift layer; 18 silicon carbide epitaxial layer; 21 body region; 22 first connection region (connection region); 23 second connection region; 31 gate electrode; 32 filling portion; 33 first insulating film; 34 second insulating film; 35 interlayer insulating film; 36 source electrode; 37 source wire; 38 fourth insulating film; 39 third insulating film; 40 upper end portion; 41 first main surface; 42 second main surface; 43 first wire layer; 44 second wire layer; 50 silicon carbide single-crystal substrate; 51 drain electrode; 60 conductive film; 61 first portion; 62 second portion; 63 third portion; 81 second curvature portion; 82 second linear portion; 91 first curvature portion; 92 first linear portion; 100 silicon carbide semiconductor device (MOSFET); 101 first direction; 102 second direction; 103 thickness; 104, 105, 106, 111 width; 112 interval; 120 unit cell.

The invention claimed is:

1. A silicon carbide semiconductor device comprising a silicon carbide substrate having a first main surface, and a second main surface opposite to the first main surface,
the first main surface being provided with a first trench and a second trench,
the first trench being defined by a first side surface, and a first bottom surface continuous with the first side surface,
the second trench being defined by a second side surface, and a second bottom surface continuous with the second side surface, the silicon carbide substrate including
a first impurity region having a first conductivity type,
a second impurity region in contact with the first impurity region and having a second conductivity type different from the first conductivity type,
a third impurity region provided on the second impurity region so as to be separated from the first impurity region and having the first conductivity type,
a fourth impurity region provided between the second main surface and the second bottom surface and having the second conductivity type, the fourth impurity region having a higher impurity concentration than the second impurity region, and
a fifth impurity region in contact with the third impurity region and having the second conductivity type,
the silicon carbide semiconductor device further comprising:
a first insulating film in contact with each of the first side surface and the first bottom surface;
a gate electrode provided on the first insulating film;
a second insulating film in contact with each of the second side surface and the second bottom surface; and
a source electrode electrically connected to the third impurity region,
the second impurity region having a connection region which is electrically connected to the fourth impurity region and which extends toward the fourth impurity region along the second side surface,
the fifth impurity region is separated from the second bottom surface of the second trench,
as seen in a direction perpendicular to the second main surface, in each unit cell, an area of the source electrode is greater than an area of an opening in the second trench,
as seen in the direction perpendicular to the second main surface, in each unit cell, the area of the opening in the second trench is smaller than an area of an opening in the first trench, and
the source electrode is separated from the second insulating film.

2. The silicon carbide semiconductor device according to claim 1, wherein
the fourth impurity region is separated from the second bottom surface.

3. The silicon carbide semiconductor device according to claim 1, wherein
the fourth impurity region is in contact with the second bottom surface.

4. The silicon carbide semiconductor device according to claim 1, wherein
as seen in the direction perpendicular to the second main surface, the first trench has a stripe shape.

5. The silicon carbide semiconductor device according to claim 1, wherein
as seen in the direction perpendicular to the second main surface, the area of the opening in the second trench is greater than an area of the second bottom surface.

6. The silicon carbide semiconductor device according to claim 1, wherein
an angle formed between the first side surface and the first bottom surface is not less than 80° and not more than 100°, and an angle formed between the second side surface and the second bottom surface is greater than the angle formed between the first side surface and the first bottom surface.

7. The silicon carbide semiconductor device according to claim 1, further comprising:
a filling portion provided on the second insulating film; and
an interlayer insulating film covering each of the gate electrode and the filling portion.

8. The silicon carbide semiconductor device according to claim 1, wherein
as seen in the direction perpendicular to the second main surface, the fourth impurity region has a first portion overlapping the first bottom surface.

9. The silicon carbide semiconductor device according to claim 8, wherein
as seen in the direction perpendicular to the second main surface, the fourth impurity region has a second portion overlapping the fifth impurity region and electrically connected to the first portion.

10. The silicon carbide semiconductor device according to claim 1, wherein
as seen in the direction perpendicular to the second main surface, the first trench extends in a first direction parallel to the second main surface, and the second trench is provided next to the first trench in the first direction.

11. A silicon carbide semiconductor device comprising a silicon carbide substrate having a first main surface, and a second main surface opposite to the first main surface,
the first main surface being provided with a first trench and a second trench,
the first trench being defined by a first side surface, and a first bottom surface continuous with the first side surface,
the second trench being defined by a second side surface, and a second bottom surface continuous with the second side surface,
the silicon carbide substrate including
a first impurity region having a first conductivity type,
a second impurity region in contact with the first impurity region and having a second conductivity type different from the first conductivity type,
a third impurity region provided on the second impurity region so as to be separated from the first impurity region and having the first conductivity type,
a fourth impurity region provided between the second main surface and the second bottom surface and having the second conductivity type, the fourth impurity region having a higher impurity concentration than the second impurity region, and
a fifth impurity region in contact with the third impurity region and having the second conductivity type,
the silicon carbide semiconductor device further comprising:
a first insulating film in contact with each of the first side surface and the first bottom surface;
a gate electrode provided on the first insulating film;
a second insulating film in contact with each of the second side surface and the second bottom surface;
a source electrode electrically connected to the third impurity region;
a filling portion provided on the second insulating film; and
an interlayer insulating film covering each of the gate electrode and the filling portion,
the second impurity region having a connection region which is electrically connected to the fourth impurity region and which extends toward the fourth impurity region along the second side surface,
the fifth impurity region is separated from the second bottom surface of the second trench, as seen in a direction perpendicular to the second main surface, in each unit cell, an area of an opening in the second trench being smaller than an area of an opening in the first trench,
as seen in the direction perpendicular to the second main surface, in each unit cell, an area of the source electrode being greater than the area of the opening in the second trench,
as seen in the direction perpendicular to the second main surface, the area of the opening in the second trench being greater than an area of the second bottom surface,
as seen in the direction perpendicular to the second main surface, the first trench extending in a first direction parallel to the second main surface, and the second trench being provided next to the first trench in the first direction, and
the source electrode is separated from the second insulating film.

\* \* \* \* \*